(12) United States Patent
Vana, Jr. et al.

(10) Patent No.: US 11,444,401 B2
(45) Date of Patent: Sep. 13, 2022

(54) FLAME-RETARDANT FLAT ELECTRICAL CABLE

(71) Applicant: 3M INNOVATIVE PROPERTIES COMPANY, St. Paul, MN (US)

(72) Inventors: James G. Vana, Jr., Cedar Park, TX (US); Rocky D. Edwards, Lago Vista, TX (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 16/578,662

(22) Filed: Sep. 23, 2019

(65) Prior Publication Data

US 2020/0112115 A1 Apr. 9, 2020

Related U.S. Application Data

(60) Provisional application No. 62/740,498, filed on Oct. 3, 2018.

(51) Int. Cl.
*H01R 12/77* (2011.01)
*H01B 7/08* (2006.01)
(Continued)

(52) U.S. Cl.
CPC ......... *H01R 12/771* (2013.01); *H01B 7/0838* (2013.01); *H01B 7/295* (2013.01);
(Continued)

(58) Field of Classification Search
CPC ...... H01R 12/771; H01R 12/62; H01R 12/79; H01R 13/02; H01R 12/59; H01R 12/596; H01R 12/61; H01R 12/77; H01B 7/0838; H01B 7/295; H01B 11/002; H01B 7/0045; H01B 7/0807; H01B 7/0861; H05K 9/0098; H05K 1/117; H05K 2201/09409; H05K 2201/10356; H05K 2201/09236; H05K 1/0298; H05K 2201/09245; H05K 3/3405
See application file for complete search history.

(56) References Cited

U.S. PATENT DOCUMENTS 2,135,985 A * 11/1938 Mitchell ................. H01B 7/28
174/108
3,821,139 A * 6/1974 Alia ........................ C08L 23/34
524/143
(Continued)

FOREIGN PATENT DOCUMENTS

CN 110993152 B 11/2021
WO WO 2012/030365 3/2012

*Primary Examiner* — Travis S Chambers
(74) *Attorney, Agent, or Firm* — Robert S. Moshrefzadeh

(57) ABSTRACT

A flat electrical cable extends longitudinally along a length of the cable. The flat electrical cable includes a plurality of conductor sets extending along the length of the cable. Each conductor set includes one or more insulated electrical conductors. Each insulated conductor includes a central conductor surrounded by a first dielectric material. The plurality of conductor sets includes a middle conductor set disposed between two other conductor sets and an edge conductor set disposed proximal to a longitudinal edge of the cable. The first dielectric material of each insulated conductor of the edge, but not the middle, conductor set includes an intumescent flame retardant material.

15 Claims, 6 Drawing Sheets

(51) Int. Cl.
*H01B 7/295* (2006.01)
*H01B 11/00* (2006.01)
*H05K 9/00* (2006.01)
*H05K 1/11* (2006.01)

(52) U.S. Cl.
CPC .......... *H01B 11/002* (2013.01); *H05K 1/117* (2013.01); *H05K 9/0098* (2013.01); *H05K 2201/09409* (2013.01); *H05K 2201/10356* (2013.01)

(56) References Cited

U.S. PATENT DOCUMENTS

| | | | | |
|---|---|---|---|---|
| 3,971,882 | A * | 7/1976 | Alia | C08K 3/22 |
| | | | | 174/110 SR |
| 5,525,757 | A | 6/1996 | O'Brien | |
| 10,102,944 | B2 * | 10/2018 | Kohori | H01B 7/28 |
| 10,270,210 | B2 * | 4/2019 | Schumacher | H05K 1/0228 |
| 2011/0198105 | A1 * | 8/2011 | Shanai | C08L 51/06 |
| | | | | 174/110 SR |
| 2015/0311643 | A1 * | 10/2015 | Gundel | H01B 11/203 |
| | | | | 174/74 R |
| 2017/0125137 | A1 * | 5/2017 | Chin | H01B 9/028 |

* cited by examiner

FLAME-RETARDANT FLAT ELECTRICAL CABLE

TECHNICAL FIELD

The present disclosure relates generally to electrical cables, and more specifically to flame-retardant flat electrical cables.

BACKGROUND

Electrical cables for transmission of electrical signal are known. It may be desired that such cables have suitable signal transmission properties and suitable flame retardancy.

SUMMARY

In one aspect, the present disclosure provides a flat electrical cable extending longitudinally along a length of the cable. The flat electrical cable includes a plurality of conductor sets extending along the length of the cable. Each conductor set includes one or more insulated electrical conductors. Each insulated conductor includes a central conductor surrounded by a first dielectric material. The plurality of conductor sets includes a middle conductor set disposed between two other conductor sets and an edge conductor set disposed proximal to a longitudinal edge of the cable. The first dielectric material of each insulated conductor of the edge, but not the middle, conductor set includes an intumescent flame retardant material.

In another aspect, the present disclosure provides a connector assembly including a flat electrical cable. The flat electrical cable extends longitudinally along a length of the cable. The flat electrical cable includes a plurality of conductor sets extending along the length of the cable. Each conductor set includes one or more insulated electrical conductors. Each insulated conductor includes a central conductor surrounded by a first dielectric material. The plurality of conductor sets includes a middle conductor set disposed between two other conductor sets and an edge conductor set disposed proximal to a longitudinal edge of the cable. The first dielectric material of each insulated conductor of the edge, but not the middle, conductor set includes an intumescent flame retardant material. The connector assembly further includes a plurality of contact pads arranged in a row and including a plurality of middle contact pads disposed between a pair of edge contact pads disposed at opposing ends of the row. An insulated conductor of the edge conductor set is terminated at a middle contact pad, and an insulated conductor of the middle conductor set is terminated at an edge contact pad.

In another aspect, the present disclosure provides a flat electrical cable extending longitudinally along a length of the cable. The flat electrical cable includes a plurality of conductor sets extending along the length of the cable. Each conductor set includes one or more insulated electrical conductors. Each insulated conductor includes a central conductor surrounded by a first dielectric material. The plurality of conductor sets includes a middle conductor set disposed between two other conductor sets and an edge conductor set disposed proximal to a longitudinal edge of the cable. The first dielectric material of each insulated conductor of the edge, but not the middle, conductor set includes an intumescent flame retardant material. Each insulated conductor of the edge conductor set further includes a second dielectric material disposed between the central conductor and the first dielectric material. The second dielectric material is devoid of the intumescent flame retardant material.

In another aspect, the present disclosure provides a connector assembly including a flat electrical cable extending longitudinally along a length of the cable. The flat electrical cable includes a plurality of conductor sets extending along the length of the cable. Each conductor set includes one or more insulated electrical conductors. Each insulated conductor includes a central conductor surrounded by a first dielectric material. The plurality of conductor sets includes a middle conductor set disposed between two other conductor sets and an edge conductor set disposed proximal to a longitudinal edge of the cable. The first dielectric material of each insulated conductor of the edge, but not the middle, conductor set comprises an intumescent flame retardant material. The connector assembly further includes a circuit board. The circuit board includes pluralities of first and second contact pads arranged in respective first and second rows along opposing respective first and second edges of the circuit board. The plurality of first contact pads includes a plurality of first middle contact pads disposed between a pair of first edge contact pads disposed at opposing ends of the first row. An insulated conductor of the middle conductor set of the cable is terminated at a first middle contact pad in the plurality of first middle contact pads, and an insulated conductor of the edge conductor set of the cable is terminated at a first edge contact pad in the pair of first edge contact pads. The plurality of second contact pads includes a plurality of second middle contact pads disposed between a pair of second edge contact pads disposed at opposing ends of the second row. A first conductive trace of the circuit board connects a first middle contact pad in the plurality of first middle contact pads to a second edge contact pad in the pair of second edge contact pads, and a second conductive trace of the circuit board connects a first edge contact pad in the pair of first edge contact pads to a second middle contact pad in the plurality of second middle contact pads.

BRIEF DESCRIPTION OF THE DRAWINGS

Exemplary embodiments disclosed herein may be more completely understood in consideration of the following detailed description in connection with the following figures. The figures are not necessarily drawn to scale. Like numbers used in the figures refer to like components. However, it will be understood that the use of a number to refer to a component in a given figure is not intended to limit the component in another figure labeled with the same number.

DETAILED DESCRIPTION

Figure 1:
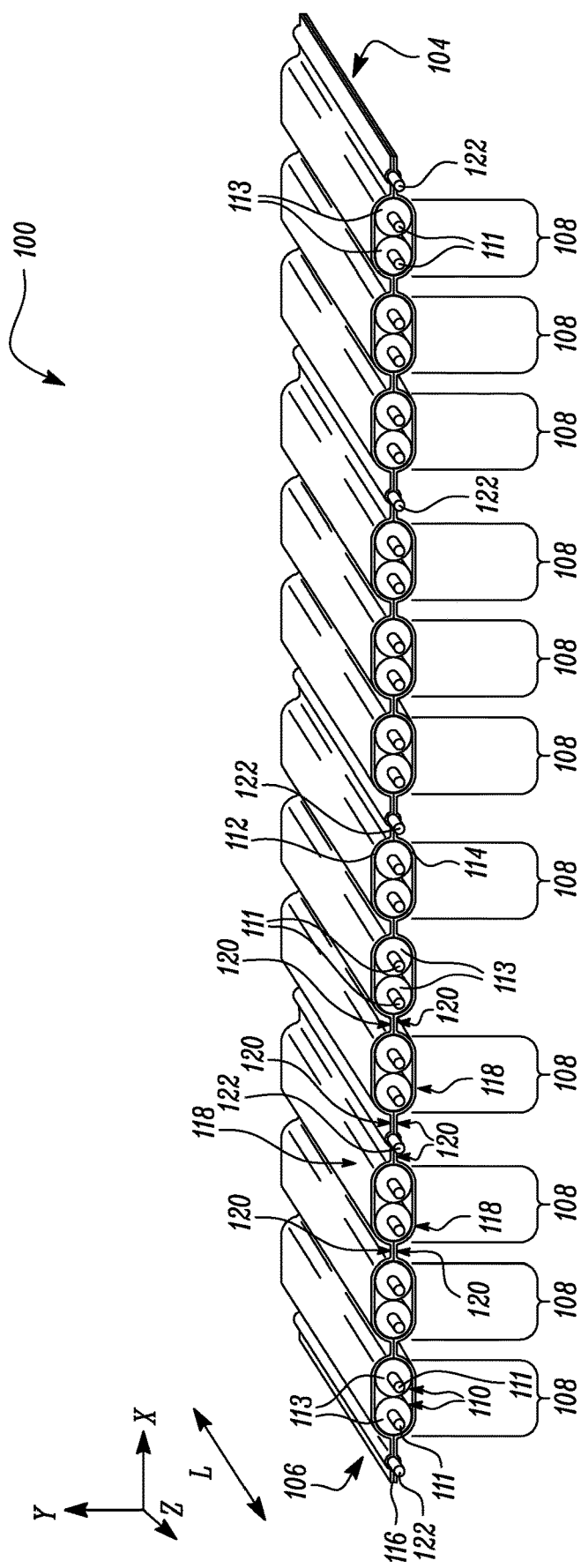
FIG. 1 is a schematic perspective view of a flat electrical cable according to one embodiment of the present disclosure.

In the following description, reference is made to the accompanying figures that form a part thereof and in which various embodiments are shown by way of illustration. It is to be understood that other embodiments are contemplated and may be made without departing from the scope or spirit of the present disclosure. The following detailed description, therefore, is not to be taken in a limiting sense.

A dielectric material is an electrically insulating material that can be polarized by an applied electric field. An intumescent flame retardant material is any material that swells upon exposure to heat such that when it is included in a dielectric material it provides a flame retardant effect. As used herein, a dielectric material described as including an intumescent flame retardant includes an effective amount of the intumescent flame retardant. For example, the dielectric material can include the intumescent flame retardant at a sufficient level (e.g., at no less than 5%, or no less than 10%, or no less 20% by weight) that it substantially improves the flame retardance of the dielectric material. The effective amount or sufficient level may depend on the type of intumescent flame retardant material used and/or the type of dielectric material used. As used herein, a dielectric material not including an intumescent flame retardant or a dielectric material devoid of an intumescent flame retardant is a dielectric material that does not include an effective amount of intumescent flame retardant. For example, the dielectric material may include substantially less than the sufficient level for substantially improving the flame retardance of the dielectric material (e.g., the dielectric material may include less than 15%, or less than 10%, or less than 5%, or less than 1%, or less than 0.5%, or 0% by weight of intumescent flame retardant). For example, if the intumescent flame retardant is included at a sufficient level, it can cause the dielectric material to swell and form an intumescent char, while if smaller amounts are included, there may be no significant swelling of the dielectric material and no significant intumescent char generated. Thus, a dielectric material including less than the effective amount or less than the sufficient level of intumescent flame retardant can be considered to be devoid of intumescent flame retardant. In some embodiments, a dielectric material described as not including an intumescent flame retardant or described as devoid of an intumescent flame retardant is completely free of intumescent flame retardant or substantially free (e.g., less than 5%, or less than 1%, or less than 0.5% by weight) of intumescent flame retardant.

Intumescent flame retardants (IFR) typically include a condensed-phase flame retardant mechanism. An IFR system may include a precursor of a carbonization catalyst, such as ammonium polyphosphate (APP), a carbonization agent, such as a polyol, and a blowing agent. By the sequence of esterification, carbonization, expansion and solidification, the intumescent char generated from the IFR may cover the underlying material to protect it from the heat or flame and to slow down the mass transfer.

Referring now to the Figures, FIG. 1 illustrates a flat electrical cable 100 according to an embodiment of the present disclosure. The flat electrical cable 100 (interchangeably referred to as "the cable 100") extends longitudinally along a length of the cable 100. Specifically, the flat electrical cable 100 extends along a longitudinal axis "L" of the cable 100. The longitudinal axis "L" is parallel to the Z-axis. Further, the flat electrical cable 100 has a width along the X-axis and a height along the Y-axis. The flat electric cable 100 further includes longitudinal edges 104, 106. The longitudinal edges 104, 106 are disposed at respective ends of the cable 100 with respect to the X-axis. The longitudinal edges 104, 106 extend generally along the longitudinal axis "L" of the cable 100.

The flat electrical cable 100 includes a plurality of conductor sets 108 extending along the length of the cable 100. Specifically, the conductor sets 108 are spaced apart from each other and extend substantially along the longitudinal axis "L" of the cable 100. Further, the conductor sets 108 may be generally arranged in a single plane. Each conductor set 108 includes one or more insulated electrical conductors 110 (hereinafter referred to as "the insulated electrical conductors 110"). In the illustrated embodiment of FIG. 1, each conductor set 108 includes two substantially parallel insulated conductors 110. Two insulated conductors 110 of each conductor set 108 are disposed adjacent to each other. Further, each insulated conductor 110 may extend substantially along the longitudinal axis "L" of the cable 100. The insulated conductors 110 may include insulated signal wires, insulated power wires, or insulated ground wires. Each insulated conductor 110 includes a central conductor 111 surrounded by a first dielectric material 113. Specifically, the central conductor 111 of each insulated conductor 110 is surrounded by a layer of the first dielectric material 113. In some embodiments, the central conductor 111 of each insulated conductor 110 and the layer of the first dielectric material 113 are concentric to each other.

The flat electrical cable 100 further includes a first shielding layer 112 disposed on a top side of the cable 100, and a second shielding layer 114 disposed on a bottom side of the cable 100. The top and bottom sides of the cable 100 are defined with respect to the Y-axis. The first and second shielding layers 112, 114 are disposed around the conductor sets 108. Further, the first and second shielding layers 112, 114 are generally parallel to each other and extend along the longitudinal axis "L" of the cable 100. In an embodiment, the first shielding layer 112 and the second shielding layer 114 are bonded to each other to form a longitudinal edge 104 or 106 of the cable 100. Specifically, the first and second shielding layers 112, 114 may be bonded to each other to form the longitudinal edges 104, 106 of the cable 100. A conformable adhesive layer 116 is disposed between the first and second shielding layers 112, 114 and bonds the first and second shielding layers 112, 114 to each other on both sides of each conductor set 108. The first shielding layer 112 and the second shielding layer 114 in combination at least partially enclose the plurality of conductor sets 108. In the illustrated embodiment of FIG. 1, each of the first shielding layer 112 and the second shielding layer 114 includes a plurality of cover portions 118 and a plurality of pinched portions 120 disposed adjacent to the plurality of cover portions 118. The cover portions 118 and the pinched portions 120 are arranged such that, in a transverse cross-section, the cover portions 118 of the first and second shielding layers 112, 114 in combination substantially surround the conductor sets 108, and the pinched portions 120 of the first and second shielding layers 112, 114 in combination form pinched portions of the cable 100 on each side of each conductor set 108. The adhesive layer 116 may bond the first shielding layer 112 to the second shielding layer 114 in each of the pinched portions 120 of the cable 100.

In one embodiment, the conductor sets 108 have a substantially curvilinear cross-sectional shape, and the first and second shielding layers 112, 114 are disposed around the conductor sets 108 such as to substantially conform to and maintain the cross-sectional shape. Maintaining the cross-sectional shape maintains the electrical characteristics of the conductor sets 108 as intended in the design of conductor sets 108. In an embodiment, each of the first shielding layer 112 and the second shielding layer 114 includes a conductive material. In some embodiments, the conductive material of the first shielding layer 112 and the second shielding layer 114 includes aluminum. For example, the conductive material may be an aluminum alloy. In other embodiments, the conductive material of the first shielding layer 112 and the second shielding layer 114 includes gold, silver, copper, and alloys thereof. In an embodiment, the flat electrical cable 100 further includes an insulative jacket (not shown) disposed around the first and second shielding layers 112, 114. The first and second shielding layers 112, 114 may also act as primary flame barriers for the cable 100, and protect the conductor sets 108 from burning.

Although in the embodiment illustrated in FIG. 1, each conductor set 108 includes two insulated conductors 110 in a twin-axial configuration, in other embodiments, each conductor set 108 may include one or more insulated conductors 110. For example, instead of the flat electrical cable 100 including twelve conductor sets 108 with each conductor set 108 including two insulated conductors 110, as shown in FIG. 1, the flat electrical cable 100 may include three conductor sets 108 with each conductor set 108 including four insulated conductors 110. Alternatively, the flat electrical cable 100 may include twenty four conductor sets 108 with each conductor set 108 including one insulated conductor 110. This flexibility in arrangements of the conductor sets 108 and the insulated conductors 110 may allow the flat electrical cable 100 to be configured suitably for an intended application. For example, the conductor sets 108 and the insulated conductors 110 may be configured to form a multiple twin-axial cable, i.e., multiple conductor sets 108 with each conductor set 108 including two insulated conductors 110, a multiple coaxial cable, i.e., multiple conductor sets 108 with each conductor set 108 including one insulated conductor 110, or a combination thereof. Although in the illustrated embodiment of FIG. 1, each insulated conductor 110 is depicted as having a circular shape, each insulated conductor 110 may have any alternative shape as per application requirements or as a result of manufacturing variations, for example. For example, each insulated conductor 110 may have an elliptical shape, an oval shape, a polygonal shape, and so forth. Further, the central conductor 111 of each insulated conductor 110 may have any alternative shape apart from a circular shape. Moreover, a shape of the layer of the first dielectric material 113 may differ from a shape of the corresponding central conductor 111. The present disclosure is not limited by any shape of each insulated conductor 110, each central conductor 111, or each layer of the first dielectric material 113. The central conductor 111 may also be centrally or eccentrically disposed within the insulated conductor 110.

The flat electrical cable 100 further includes a ground conductor 122 extending along the length of the cable 100. In the embodiment illustrated in FIG. 1, the flat electric cable 100 includes multiple ground conductors 122. Specifically, one ground conductor 122 is provided on each side of three conductor sets 108, i.e., three conductor sets 108 are disposed between two ground conductors 122. Therefore, the flat electric cable 100 includes five ground conductors 122. However, any suitable number of ground conductors 122 may be provided. The ground conductors 122 may include ground wires or drain wires. The ground conductors 122 are spaced apart from and extend in substantially the same direction as the insulated conductors 110. Specifically, the ground conductors 122 extend generally along the longitudinal axis "L" of the cable 100. The conductor sets 108 and the ground conductors 122 may be generally arranged in a single plane. The first and second shielding layers 112, 114 are disposed around the ground conductors 122 and the adhesive layer 116 bonds the first and second shielding layers 112, 114 to each other on both sides of the ground conductors 122. The ground conductors 122 may electrically contact at least one of the first and second shielding layers 112, 114.

Figure 2:
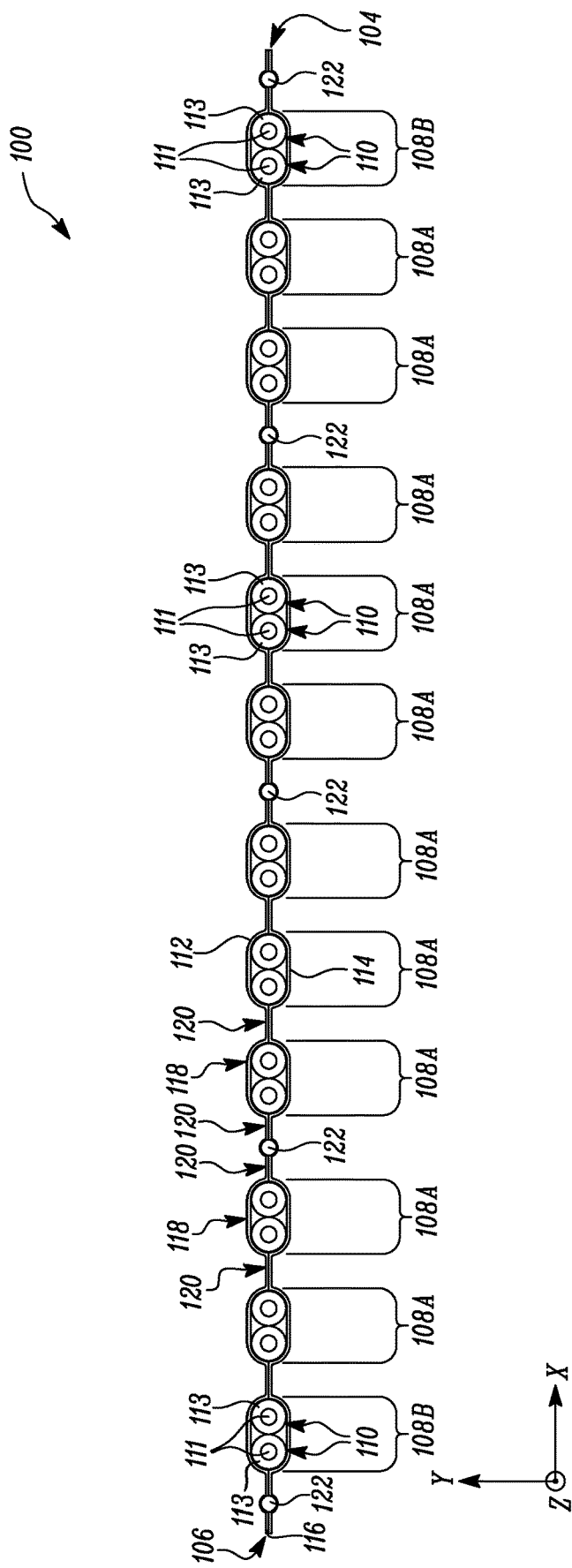
FIG. 2 is a schematic front cross-sectional view of the flat electrical cable of FIG. 1.

FIG. 2 illustrates another view of the flat electrical cable 100. The plurality of conductor sets 108 (shown in FIG. 1) includes a middle conductor set 108A disposed between two other conductor sets 108 and an edge conductor set 108B disposed proximal to the longitudinal edge 104 or 106 of the cable 100. As illustrated in FIG. 2, the flat electrical cable 100 includes two edge conductor sets 108B disposed proximal to respective longitudinal edges 104, 106 of the cable 100. Further, the flat electrical cable 100 includes multiple middle conductor sets 108A disposed between the edge conductor sets 108B. Each middle conductor set 108A is disposed between either two other middle conductor sets 108A, or another middle conductor set 108A and one edge conductor set 108B. In the illustrated embodiment of FIG. 2, the flat electric cable 100 includes ten middle conductor sets 108A disposed between the two edge conductor sets 108B. However, in alternative configurations, the cable 100 may include one middle conductor set 108A disposed between two edge conductor sets 108B. Further, a ground conductor 122 is disposed between the edge conductor set 108B and the longitudinal edge 104 or 106 of the cable 100. Specifically, one ground conductor 122 is disposed between each edge conductor set 108B and the respective longitudinal edge 104 or 106 of the cable 100.

In an embodiment, the first dielectric material 113 of each insulated conductor 110 of the edge, but not the middle, conductor set 108B includes an intumescent flame retardant material. In other words, the layer of the first dielectric material 113 of each insulated conductor 110 of each edge conductor set 108B includes the intumescent flame retardant material. However, the layer of the first dielectric material 113 of each insulated conductor 110 of each middle conductor set 108A is devoid of any intumescent flame retardant material. The first dielectric material 113 of each insulated conductor 110 of each edge conductor set 108B surrounds the corresponding central conductor 111. In some embodiments, each insulated conductor 110 of the edge conductor set 108B further includes an optional second dielectric material (not shown) disposed between the central conductor 111 and the first dielectric material 113. The second dielectric material is devoid of the intumescent flame retardant material. In other words, each insulated conductor 110 of each edge conductor set 108B may include an inner layer of the second dielectric material surrounding the corresponding central conductor 111, and an outer layer of the first dielectric material 113 surrounding the inner layer. The inner layer is devoid of the intumescent flame retardant material, while the outer layer includes the intumescent flame retardant material.

Upon burning, the intumescent flame retardant material of the first dielectric material 113 may generate a microporous carbonaceous foam at the longitudinal edges 104, 106 of the flat electrical cable 100. The carbonaceous foam may expand and get attached to the longitudinal edges 104, 106 of the cable 100, and prevent the first and second shielding layers 112, 114 (i.e., the primary flame barriers) from separating and exposing the conductor sets 108 to a flame. The intumescent carbonaceous microporous foam may therefore act as a flame barrier at the longitudinal edges 104, 106 of the cable 100. In order to provide adequate flame resistance, the intumescent flame retardant material may be included in the insulated conductors 110 of each edge conductor set 108B, and not in the middle conductor sets 108A.

Halogen is a common ingredient in flame retardant materials used in cables. However, certain industry standards or other specifications may specify halogen-free materials. Many flame retardant materials with low or no halogen content that may be included in an insulating material of a cable modify the dielectric properties of the insulating material and this can degrade the high speed data transmission properties of the cable.

In some embodiments, the intumescent flame retardant material may have low halogen content. In other embodiments, the intumescent flame retardant material may be halogen-free. The flat electrical cable 100 may therefore conform to certain industry standards or other specifications that require halogen-free materials as well as flame resistance. For example, the cable 100 may pass the International Electrotechnical Commission (IEC) 62638-1 Standard for Communication Technology Equipment. Specifically, the cable 100 may pass the IEC 60332-2 VW1 flame test which is part of the IEC 62638-1 Standard. Additionally, the cable 100 may conform to low halogen requirements as set by certain manufacturers of electronic equipment. For example, the cable 100 conforms to the low halogen requirements of the HPE-011-01B standard for cables as set by Hewlett Packard Enterprise (HPE). The HPE-011-01B requires a maximum of 1000 parts per million (ppm) of bromine and a maximum of 1000 ppm of chlorine by weight in homogenous plastic material in the form of flame retardants.

Due to low halogen content of the intumescent flame retardant material, the dielectric properties of the first dielectric material 113 of each edge conductor set 108B may be modified. Specifically, the dielectric properties of the first dielectric material 113 of each edge conductor set 108B may be degraded due to the presence of the intumescent flame retardant material. Consequently, in some embodiments, the insulated conductors 110 of each edge conductor set 108B is used for low speed data transmission, power transmission, or ground connection. In other words, in some embodiments, each insulated conductor 110 of each edge conductor set 108B is used for transmitting low frequency signals. For example, the intumescent flame retardant material may increase a dielectric constant of the first dielectric material 113 from 2.25 to greater than 2.65, and increase a dissipation factor from 0.0005 to greater than 0.001, thereby resulting in lower impedance and higher attenuation for high frequency signals, for example, 4 Gigahertz (GHz) and/or greater than 8 Gigabits per second (Gbps). However, due to the absence of the flame retardant material in the insulated conductors 110 of each middle conductor set 108A, the middle conductor sets 108A can be used for high speed data transmission. In other words, each insulated conductor 110 of each middle conductor set 108A may be used for transmitting high frequency signals. It is to be noted that each insulated conductor 110 of each middle conductor set 108A may also be used for low speed data transmission, power transmission or ground connection. Specifically, each insulated conductor 110 of each middle conductor set 108A may also be used for transmitting low frequency signals.

Each insulated conductor 110 of each middle conductor set 108A may be not flame resistant. Further, the first dielectric material 113 surrounding the central conductor 111 of each insulated conductor 110 of each middle conductor set 108A may be made of a polymeric material. In some embodiments, the polymeric material may include one or more of polycarbonate, polyethylene terephthalate, polystyrene, polyamide, polyimide, polyetherimide, polyethersulfone, polyphenylene sulfide, polysulfone, polymethylpentene, polyoxymethylene, polyethylene naphthalate, polyether ether ketone, acrylonitrile butadiene styrene, polyurethane, polyethylene, polypropylene, polyester, and polybutylene terephthalate. In an embodiment, the first dielectric material 113 of each middle conductor set 108A may be a polypropylene-based resin. In an example, the polypropylene-based resin may be EP315J manufactured by LyondellBasell Industries. EP315J is an electrical grade polypropylene copolymer resin which is halogen-free and is not flame resistant. In some embodiments, the layer of the first dielectric material 113 may be laminated to the respective central conductor 111 of each middle conductor set 108A. A wire bond force greater than 0.8 pounds (lbs) or 0.36 kilograms (kgs) may be used during lamination so that the cable 100 conforms to certain industry standards.

In some embodiments, the flat electrical cable 100 may be part of a connector assembly (not shown in FIGS. 1 and 2). The connector assembly includes a plurality of contact pads arranged in a row and includes a plurality of middle contact pads disposed between a pair of edge contact pads disposed at opposing ends of the row. In some embodiments, the plurality of contact pads are part of at least one of a printed circuit board and an electrical connector. An insulated conductor 110 of the edge conductor set 108B is terminated at a middle contact pad, and an insulated conductor of the middle conductor set 108A is terminated at an edge contact pad. In some embodiments, the insulated conductors 110 of the edge conductor set 108B terminated at the middle contact pad are adapted for at least one of low speed data transmission, power transmission and ground connection. In other words, each insulated conductor 110 of each edge conductor set 108B is adapted for at least one of low speed data transmission or communication, power transmission and ground connection. In some embodiments, the insulated conductors 110 of the middle conductor set 108A terminated at the edge contact pad are adapted for high speed data transmission. In other words, each insulated conductor 110 of each middle conductor set 108A is adapted for high speed data transmission or communication. In some embodiments, low speed data transmission occurs in a signal frequency range from about 50 Megahertz (MHz) to about 100 MHz. In some embodiments, high speed data transmission occurs in a signal frequency range from about 1 GHz to about 50 GHz.

In some embodiments, the connector assembly includes a plurality of contact pad sets arranged in a row, each contact pad set corresponding to a different conductor set 108 of the cable 100, and including one or more contact pads. The plurality of contact pad sets include a middle contact pad set disposed between two other contact pad sets and an edge contact pad set disposed at an end of the row. In some embodiments, the plurality of contact pad sets are part of at least one of a printed circuit board and an electrical connector. The insulated conductors 110 of the edge conductor set 108B are terminated at the contact pads of the middle contact pad set, and the insulated conductors 110 of the middle conductor set 108A are terminated at the contact pads of the edge contact pad set. In some embodiments, the insulated conductors 110 of the edge conductor set 108B terminated at the contact pads of the middle contact pad set are adapted for at least one of low speed data transmission, power transmission and ground connection. In other words, each insulated conductor 110 of each edge conductor set 108B is adapted for at least one of low speed data transmission, power transmission and ground connection. In some embodiments, the insulated conductors 110 of the middle conductor set 108A terminated at the contact pads of the edge contact pad set are adapted for high speed data transmission. In other words, each insulated conductor 110 of each middle conductor set 108A is adapted for high speed data transmission. In some embodiments, low speed data transmission occurs in a signal frequency range from about 50 MHz to about 100 MHz. In some embodiments, high speed data transmission occurs in a signal frequency range from about 1 GHz to about 50 GHz.

Figure 3:
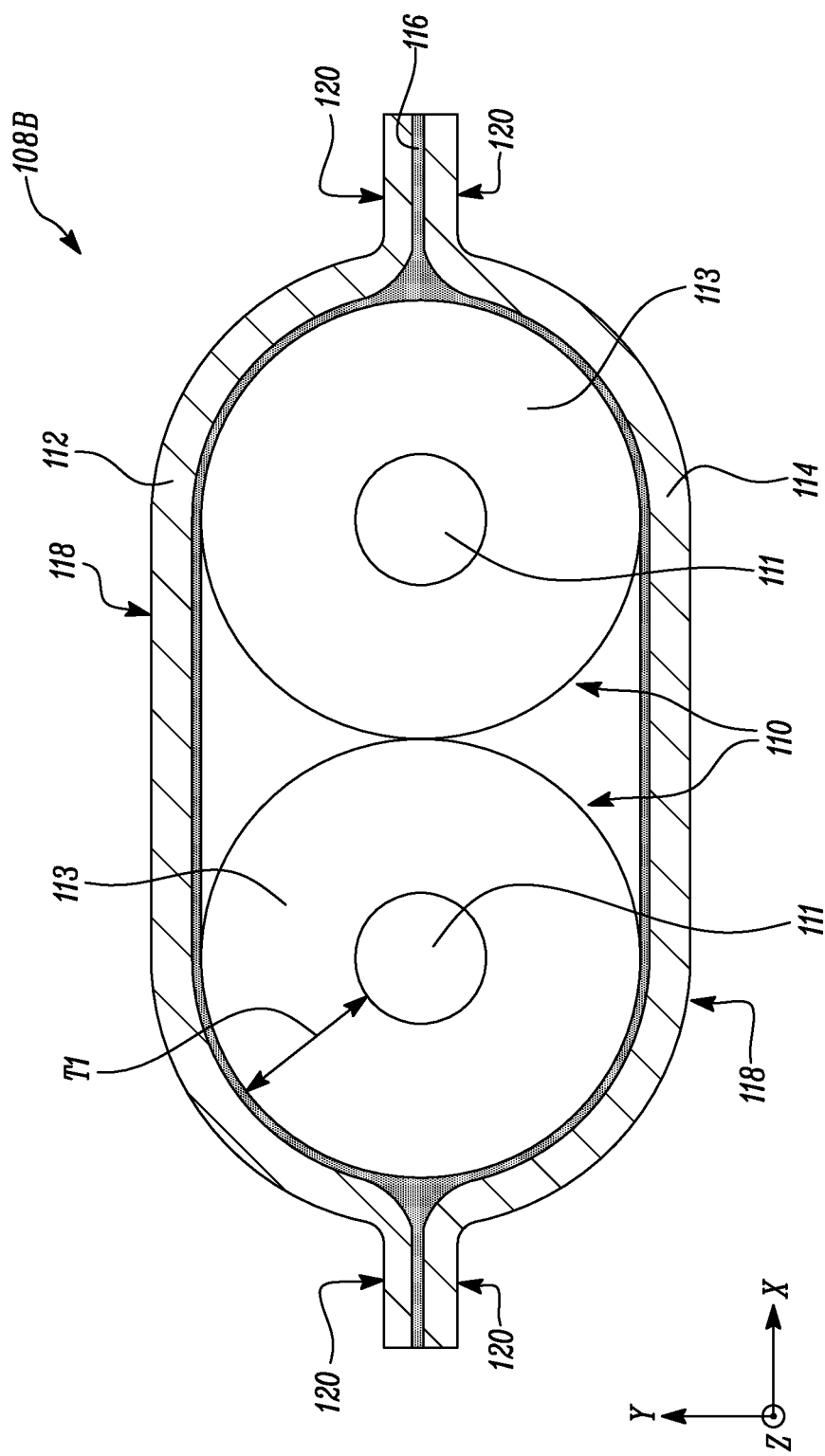
FIG. 3 is a schematic front cross-sectional view of an edge conductor of the flat electrical cable according to one embodiment of the present disclosure.

FIG. 3 illustrates a sectional front view of the edge conductor set 108B. The edge conductor set 108B illustrated in FIG. 3 may be any one of the two edge conductor sets 108B (shown in FIG. 2) disposed proximal to the respective longitudinal edges 104, 106 of the cable 100. The edge conductor set 108B includes two insulated conductors 110 disposed adjacent to each other. Each insulated conductor 110 includes the central conductor 111 surrounded by a layer of the first dielectric material 113. The first dielectric material 113 includes the intumescent flame retardant material. In some embodiments, the intumescent flame retardant material includes magnesium oxide (MgO). In some embodiments, the first dielectric material 113 includes about 20% to about 35% by weight of the intumescent flame retardant material in a polymeric substrate. In some embodiments, the first dielectric material 113 of each insulated conductor 110 of the edge conductor set 108B includes at least 20% magnesium oxide by weight. In some embodiments, the first dielectric material 113 of each insulated conductor 110 of the edge conductor set 108B includes about 50% to about 65% magnesium oxide by weight. In other embodiments, the first dielectric material 113 includes at least 30%, 35%, 50%, 70%, 80%, 90%, 95%, 98%, or 99% magnesium oxide by weight. In another embodiment, the intumescent flame retardant material includes alumina trihydrate. In some embodiments, the first dielectric material 113 of each insulated conductor 110 of the edge conductor set 108B further includes a thermoplastic material. In a further embodiment, the thermoplastic material of the first dielectric material 113 is polypropylene. In other embodiments, the thermoplastic material of the first dielectric material 113 may include one or more of polycarbonate, polyethylene terephthalate, polystyrene, polyamide, polyimide, polyetherimide, polyethersulfone, polyphenylene sulfide, polysulfone, polymethylpentene, polyoxymethylene, polyethylene naphthalate, polyether ether ketone, acrylonitrile butadiene styrene, polyurethane, polyethylene, polypropylene, polyester, and polybutylene terephthalate. In an example, the first dielectric material 113 may be the GTP08293-44AL resin manufactured by S&E Specialty Polymers. GTP08293-44AL is a polypropylene-based, zero halogen, flame retardant material. Each insulated conductor 110 of the edge conductor set 108B may therefore be an IFR polypropylene insulated conductor or wire.

In some embodiments, a thickness "T1" of the first dielectric material 113 of each insulated conductor 110 of the edge conductor set 108B is in a range from about 10 microns (m) to about 100 μm. In other words, the thickness "T1" of the layer of the first dielectric material 113 is in a range from about 10 μm to about 100 μm. The thickness "T1" may refer to an average thickness of the layer of the first dielectric material 113. In some embodiments, the thickness "T1" of the first dielectric material 113 is less than about 100 μm, 50 μm, 30 μm, or 20 μm.

In some embodiments, the layer of the first dielectric material 113 may be laminated to the respective central conductor 111 of the edge conductor set 108B. A wire bond force greater than 0.8 pounds (lbs) may be used during lamination so that the cable 100 conforms to certain industry standards. In some embodiments, the layer of the first dielectric material 113 may be helically wrapped around the respective central conductor 111, and may also be overlappingly wrapped. In some embodiments, the layer of the first dielectric material 113 may be a vacuum deposited layer, a vapor deposited layer, a chemically vapor deposited (CVD) layer, a plasma enhanced chemically vapor deposited (PECVD) layer, a sputtering deposited layer, a low-pressure chemically vapor deposited (LPCVD) layer, a plasma assisted chemically vapor deposited (PACVD) layer, an atomic layer deposited (ALD) layer, a thermally vapor deposited layer, an electron beam vapor deposited layer, a laser ablated vapor deposited layer, and/or a physically vapor deposited (PVD) layer.

The adhesive layer 116 may also bond the first and second shielding layers 112, 114 to the insulated conductors 110 of the edge conductor set 108B. Specifically, the adhesive layer 116 may bond the first and second shielding layers 112, 114 to the layer of the first dielectric material 113 of each insulated conductor 110.

The edge conductor set 108B, as shown in FIG. 3, is purely exemplary in nature and alternative configurations of the edge conductor set 108B are possible within the scope of the present disclosure. For example, the edge conductor set 108B may include one or more insulated conductors 110 instead of two insulated conductors 110, as shown in FIG. 3. Each insulated conductor 110 may also have a non-circular shape, for example, elliptical, oval, polygonal, and so forth. The central conductor 111 and the layer of the first dielectric material 113 may have different shapes. Further, the central conductor 111 and the layer of first dielectric material 113 of each insulated conductor 110 may be eccentrically disposed with respect to each other instead of the concentric configuration depicted in FIG. 3. The layer of the first dielectric material 113 may also have a non-uniform thickness based on its shape.

Figure 4:
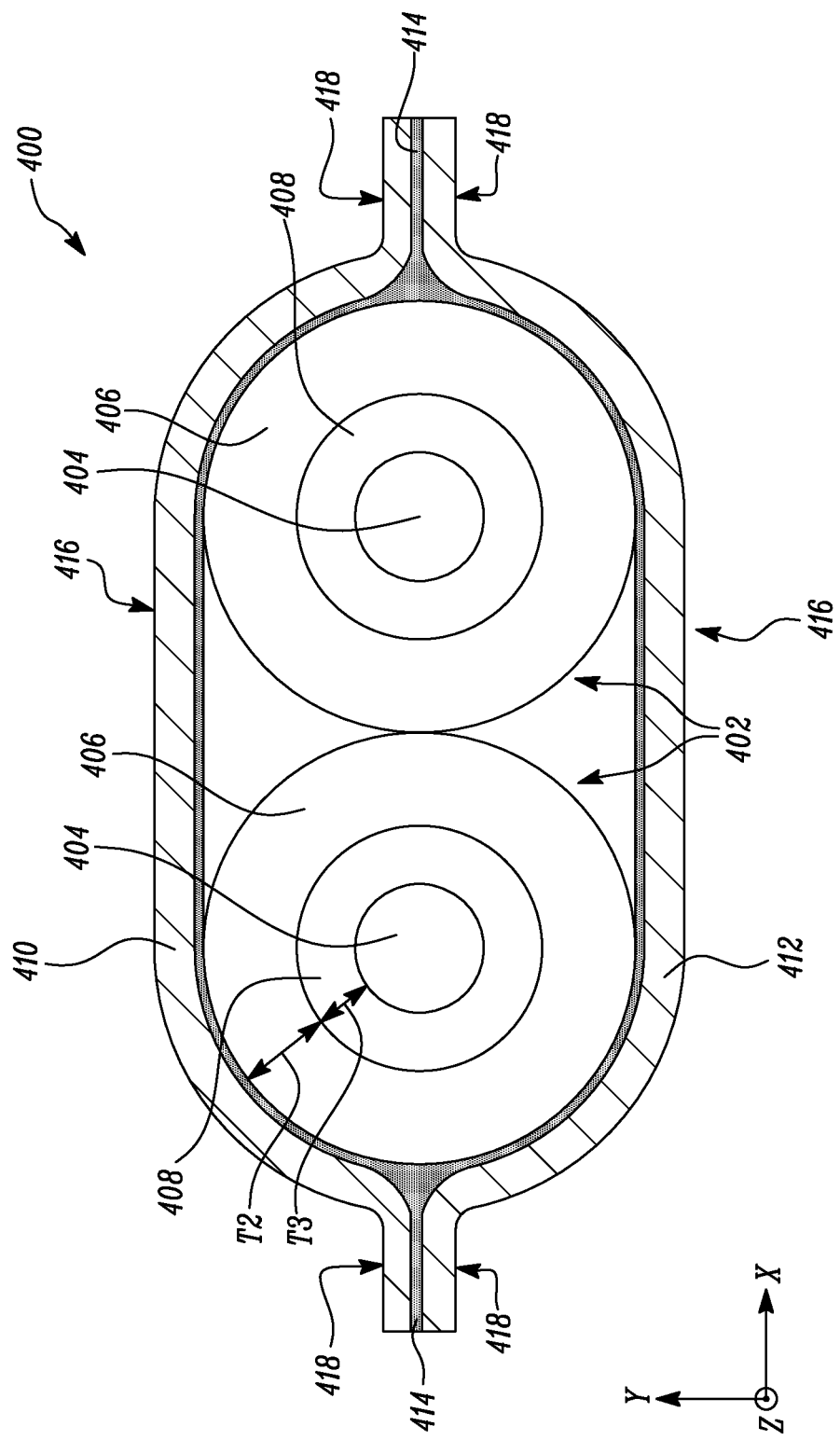
FIG. 4 is a schematic front cross-sectional view of an edge conductor of the flat electrical cable according to another embodiment of the present disclosure.

FIG. 4 illustrates a sectional front view of an edge conductor set 400 according to another embodiment of the present disclosure. The edge conductor set 400 illustrated in FIG. 4 may be any one of the two edge conductor sets disposed proximal to the respective longitudinal edges 104, 106 of the cable 100 (shown in FIG. 1). The edge conductor set 400 includes two insulated electrical conductors 402 (hereinafter referred to as "the insulated conductors 402") disposed adjacent to each other. Each insulated conductor 402 includes a central conductor 404 surrounded by a first dielectric material 406. Specifically, the central conductor 404 is surrounded by a layer of the first dielectric material 406. The first dielectric material 406 of each insulated conductor 402 of the edge conductor set 400 further includes an intumescent flame retardant. Each insulated conductor 402 of the edge conductor set 400 further includes a second dielectric material 408 disposed between the central conductor 404 and the first dielectric material 406. Specifically, a layer of the second dielectric material 408 forms an inner layer surrounding the central conductor 404 of each insulated conductor 402. The layer of the first dielectric material 406 forms an outer layer surrounding the layer of the second dielectric material 408. The second dielectric material 408 is devoid of the intumescent flame retardant material. Specifically, the second dielectric material 408 is devoid of any flame retardant material.

In some embodiments, the intumescent flame retardant material of the first dielectric material 406 includes magnesium oxide (MgO). In some embodiments, the first dielectric material 406 includes about 20% to about 35% by weight of the intumescent flame retardant material in a polymeric substrate. In some embodiments, the first dielectric material 406 of each insulated conductor 402 of the edge conductor set 400 includes at least 20% magnesium oxide by weight. In some embodiments, the first dielectric material 406 of each insulated conductor 402 of the edge conductor set 400 includes about 50% to about 65% magnesium oxide by weight. In other embodiments, the first dielectric material 406 includes at least 30%, 35%, 50%, 70%, 80%, 90%, 95%, 98%, or 99% magnesium oxide by weight. In another embodiment, the intumescent flame retardant material includes alumina trihydrate. In some embodiments, the first dielectric material 406 of each insulated conductor 402 of the edge conductor set 400 further includes a thermoplastic material. In a further embodiment, the thermoplastic material of the first dielectric material 406 is polypropylene. In other embodiments, the thermoplastic material of the first dielectric material 406 may include one or more of polycarbonate, polyethylene terephthalate, polystyrene, polyamide, polyimide, polyetherimide, polyethersulfone, polyphenylene sulfide, polysulfone, polymethylpentene, polyoxymethylene, polyethylene naphthalate, polyether ether ketone, acrylonitrile butadiene styrene, polyurethane, polyethylene, polypropylene, polyester, and polybutylene terephthalate. In an example, the first dielectric material 413 may be the GTP08293-44AL resin manufactured by S&E Specialty Polymers. GTP08293-44AL is a polypropylene-based, zero halogen, flame retardant material. Each insulated conductor 402 of the edge conductor set 400 may therefore be an IFR polypropylene insulated conductor or wire.

Due to presence of the intumescent flame retardant material, the dielectric properties of the first dielectric material 406 of each insulated conductor 402 of the edge conductor set 400 may be modified. Consequently, each insulated conductor 402 of the edge conductor set 400 may be adapted for at least one of low speed data transmission, power transmission and ground connection. In some embodiments, low speed data transmission occurs in a signal frequency range from about 50 MHz to about 100 MHz.

In some embodiments, the second dielectric material 408 includes a thermoplastic material. In some embodiments, the thermoplastic material of the second dielectric material 408 is polypropylene. In other embodiments, the thermoplastic material of the second dielectric material 408 may include one or more of polycarbonate, polyethylene terephthalate, polystyrene, polyamide, polyimide, polyetherimide, polyethersulfone, polyphenylene sulfide, polysulfone, polymethylpentene, polyoxymethylene, polyethylene naphthalate, polyether ether ketone, acrylonitrile butadiene styrene, polyurethane, polyethylene, polypropylene, polyester, and polybutylene terephthalate. In an embodiment, the second dielectric material 408 of each insulated conductor 402 of the edge conductor set 400 may be a polypropylene-based resin. In an example, the polypropylene-based resin may be EP315J manufactured by LyondellBasell Industries. EP315J is an electrical grade polypropylene copolymer resin which is halogen-free and is not flame resistant.

In some embodiments, a thickness "T2" of the first dielectric material 406 of each insulated conductor 402 of the edge conductor set 400 is in a range from about 10 microns μm to about 100 μm. In other words, the thickness "T2" of the layer of the first dielectric material 406 is in a range from about 10 μm to about 100 μm. The thickness "T2" may refer to an average thickness of the layer of the first dielectric material 406. In some embodiments, the thickness "T2" of the first dielectric material 406 is less than about 100 μm, 50 μm, 30 μm, or 20 μm.

In some embodiments, a thickness "T3" of the second dielectric material 408 of each insulated conductor 402 of the edge conductor set 400 is in a range from about 10 microns μm to about 100 μm. In other words, the thickness "T3" of the layer of the second dielectric material 408 is in a range from about 10 μm to about 100 μm. The thickness "T3" may refer to an average thickness of the layer of the second dielectric material 408. In some embodiments, the thickness "T3" of the second dielectric material 408 is less than about 100 μm, 50 μm, 30 μm, or 20 μm.

In some embodiments, the thickness "T2" of the layer of the first dielectric material 406 may be greater than the thickness "T3" of the layer of the second dielectric material 408. In other embodiments, the thickness "T2" of the layer of the first dielectric material 406 may be less than or equal to the thickness "T3" of the layer of the second dielectric material 408.

In some embodiments, the layer of the second dielectric material 408 may be laminated to the respective central conductor 404 of the edge conductor set 400. Further, the layer of the first dielectric material 406 may be laminated to the respective layer of the second dielectric material 408. A wire bond force greater than 0.8 pounds (lbs) may be used during lamination so that the resulting cable conforms to certain industry standards. In some embodiments, the layer of the second dielectric material 408 may be helically wrapped around the respective central conductor 404, and may also be overlappingly wrapped. Similarly, the layer of the first dielectric material 406 may be helically wrapped around the respective layer of the second dielectric material 408, and may also be overlappingly wrapped. In some embodiments, at least one of the layer of the first dielectric material 406 and the layer of the second dielectric material 408 may be a vacuum deposited layer, a vapor deposited layer, a chemically vapor deposited (CVD) layer, a plasma enhanced chemically vapor deposited (PECVD) layer, a sputtering deposited layer, a low-pressure chemically vapor deposited (LPCVD) layer, a plasma assisted chemically vapor deposited (PACVD) layer, an atomic layer deposited (ALD) layer, a thermally vapor deposited layer, an electron beam vapor deposited layer, a laser ablated vapor deposited layer, and/or a physically vapor deposited (PVD) layer.

The edge conductor set 400 is at least partially enclosed by a first shielding layer 410 and a second shielding layer 412. The first and second shielding layers 410, 412 are substantially similar to the first and second shielding layers 112, 114 respectively, as shown in FIGS. 1 and 2. The first shielding layer 410 is disposed on a top side of the edge conductor set 400, while the second shielding layer 412 is disposed on a bottom side of the edge conductor set 400. A conformable adhesive layer 414 is disposed between the first and second shielding layers 410, 412 and bonds the first and second shielding layers 410, 412 to each other on both sides of the edge conductor set 400. The first shielding layer 410 and the second shielding layer 412 in combination at least partially enclose the edge conductor set 400. Each of the first shielding layer 410 and the second shielding layer 412 includes a plurality of cover portions 416 (one shown in FIG. 4) and a plurality of pinched portions 418 disposed adjacent to the plurality of cover portions 416. The cover portions 416 and the pinched portions 418 are arranged such that, in a transverse cross-section, one of the cover portions 416 of the first and second shielding layers 410, 412 in combination substantially surround the edge conductor set 400, and the pinched portions 418 of the first and second shielding layers 410, 412 in combination form pinched portions on each side of the edge conductor set 400. The adhesive layer 414 may bond the first shielding layer 410 to the second shielding layer 412 in each of the pinched portions 418. The adhesive layer 414 may also bond the first and second shielding layers 410, 412 to the insulated conductors 402 of the edge conductor set 400. Specifically, the adhesive layer 414 may bond the first and second shielding layers 410, 412 to the layer of the first dielectric material 406 of each insulated conductor 402.

The edge conductor set 400, as shown in FIG. 4, is purely exemplary in nature and alternative configurations of the edge conductor set 400 are possible within the scope of the present disclosure. For example, the edge conductor set 400 may include one or more insulated conductors 402 instead of two insulated conductors 402, as shown in FIG. 4. Each insulated conductor 402 may also have a non-circular shape, for example, elliptical, oval, polygonal, and so forth. The central conductor 404, the layer of the first dielectric material 406, and the layer of the second dielectric material 408 may have different shapes. Further, the central conductor 404, the layer of first dielectric material 406, and the layer of the second dielectric material 408 of each insulated conductor 402 may be eccentrically disposed with respect to each other instead of the concentric configuration depicted in FIG. 4. At least one of the layer of the first dielectric material 406 and the layer of the second dielectric material 408 may also have a non-uniform thickness based on a respective shape.

Figure 5:
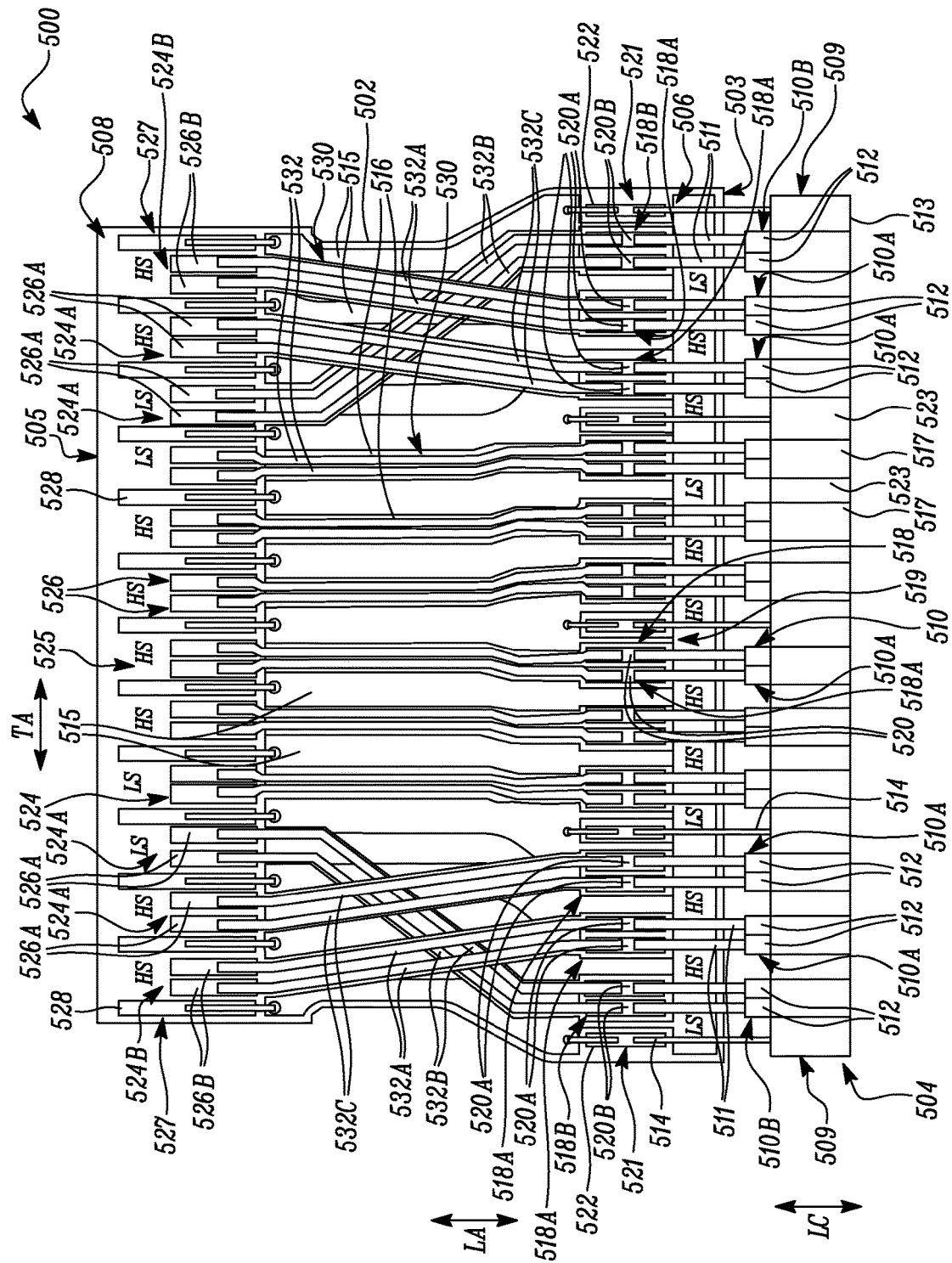
FIG. 5 is a schematic top view of a connector assembly according one embodiment of the present disclosure.

FIG. 5 illustrates a connector assembly 500. The connector assembly 500 may be used with any electrical product or device. The connector assembly 500 includes a circuit board 502 and a flat electrical cable 504. The circuit board 502 includes a first connector portion 506 and a second connector portion 508. The first connector portion 506 is disposed proximal to a first edge 503 of the circuit board 502, while the second connector portion 508 is disposed proximal to a second edge 505 of the circuit board 502. The flat electrical cable 504 is electrically connected to the first connector portion 506. The circuit board 502 may be a printed circuit board (PCB). In some embodiments, the circuit board 502 may be a paddle card. Although the connector assembly 500 is depicted as a PCB in FIG. 5, in other embodiments, the connector assembly 500 may be an electrical connector. The circuit board 502 defines a longitudinal axis "LA" and a transverse axis "TA" that is generally perpendicular to the longitudinal axis "LA". The first and second edges 503, 505 are opposing edges of the circuit board 502 with respect to the longitudinal axis "LA" of the circuit board 502.

The flat electrical cable 504 (interchangeably referred to as "the cable 504") is substantially similar to the cable 100, as shown in FIGS. 1 and 2. The flat electrical cable 504 is partially shown in FIG. 5. The flat electrical cable 504 extends along a length of the cable 504. Specifically, the flat electrical cable 504 extends along a longitudinal axis "LC" of the cable 504. Similar to the cable 100, the flat electrical cable 504 includes a plurality of conductor sets 510 extending along the length of the cable 504. In the illustrated embodiment of FIG. 5, the conductor sets 510 extend generally along the longitudinal axis "LC" of the cable 504. The cable 504 further includes longitudinal edges 509 on both sides of the cable 504. The longitudinal edges 509 extend generally along the length of the cable 504. Specifically, the longitudinal edges 509 extend generally along the longitudinal axis "LC" of the cable 504. Each conductor set 510 includes one or more insulated electrical conductors 512 (hereinafter referred to as "the insulated conductors 512").

In the illustrated embodiment of FIG. 5, each conductor set 510 includes two insulated conductors 512. However, each conductor set 510 may include any number of insulated conductors 512 based on the configurations of the first and/or second connector portions 506, 508. Each insulated conductor 512 includes a central conductor 511 surrounded by a first dielectric material. Specifically, the central conductor 511 of each insulated conductor 512 of each conductor set 510 is surrounded by a layer of the first dielectric material. The plurality of conductor sets 510 further includes a middle conductor set 510A disposed between two other conductor sets 510, and an edge conductor set 510B disposed proximal to the longitudinal edge 509 of the cable 504. As illustrated in FIG. 5, the flat electrical cable 504 includes two edge conductor sets 510B disposed proximal to respective longitudinal edges 509 of the cable 504. Further, the flat electrical cable 504 includes multiple middle conductor sets 510A disposed between the edge conductor sets 510B. Each middle conductor set 510A is disposed between either two other middle conductor sets 510A, or another middle conductor set 510A and one edge conductor set 510B. In the illustrated embodiment of FIG. 5, the flat electric cable 504 includes ten middle conductor sets 510A disposed between the two edge conductor sets 510B. However, in alternative configurations, the cable 504 may include any number of middle conductor sets 510A disposed between two edge conductor sets 510B based on the configurations of the first and/or second connector portions 506, 508.

Further, a ground conductor 514 is disposed between the edge conductor set 510B and the longitudinal edge 509 of the cable 504. Specifically, one ground conductor 514 is disposed between each edge conductor set 510B and the respective longitudinal edge 509 of the cable 504. In the embodiment illustrated in FIG. 5, the cable 504 includes multiple ground conductors 514. Specifically, one ground conductor 514 is provided on each side of three conductor sets 510, i.e., three conductor sets 510 are disposed between two ground conductors 514. Therefore, the flat electric cable 504 includes five ground conductors 514. However, any suitable number of ground conductors 514 may be provided. The ground conductors 514 may include ground wires or drain wires. The ground conductors 514 are spaced apart from and extend in substantially the same direction as the insulated conductors 512.

In an embodiment, the first dielectric material of each insulated conductor 512 of the edge, but not the middle, conductor set 510B includes an intumescent flame retardant material. In other words, the layer of the first dielectric material of each insulated conductor 512 of each edge conductor set 510B includes the intumescent flame retardant material. However, the layer of the first dielectric material of each insulated conductor 512 of each middle conductor set 510A is devoid of any intumescent flame retardant material. The first dielectric material of each insulated conductor 512 of each edge conductor set 510B surrounds the corresponding central conductor. In some embodiments, each insulated conductor 512 of the edge conductor set 510B further includes an optional second dielectric material (not shown) disposed between the central conductor and the first dielectric material. The second dielectric material is devoid of the intumescent flame retardant material. In other words, each insulated conductor 512 of each edge conductor set 510B may include an inner layer of the second dielectric material surrounding the corresponding central conductor 511, and an outer layer of the first dielectric material surrounding the inner layer. The inner layer is devoid of the intumescent flame retardant material, while the outer layer includes the intumescent flame retardant material.

In some embodiments, the intumescent flame retardant material of the first dielectric material includes magnesium oxide (MgO). In some embodiments, the first dielectric material includes about 20% to about 35% by weight of the intumescent flame retardant material in a polymeric substrate. In some embodiments, the first dielectric material of each insulated conductor 512 of each edge conductor set 510B includes at least 20% magnesium oxide by weight. In some embodiments, the first dielectric material of each insulated conductor 512 of the edge conductor sets 510B includes about 50% to about 65% magnesium oxide by weight. In other embodiments, the first dielectric material includes at least 30%, 35%, 50%, 70%, 80%, 90%, 95%, 98%, or 99% magnesium oxide by weight. In another embodiment, the intumescent flame retardant material includes alumina trihydrate. In some embodiments, the first dielectric material of each insulated conductor 512 of the edge conductor sets 510B further includes a thermoplastic material. In a further embodiment, the thermoplastic material of the first dielectric material is polypropylene. In some embodiments, the first dielectric material of each insulated conductor 512 of the edge conductor sets 510B may be a polypropylene-based, zero halogen, flame retardant material. Each insulated conductor 512 of the edge conductor sets 510B may therefore be an IFR polypropylene insulated conductor or wire.

In some embodiments, the second dielectric material includes a thermoplastic material. In some embodiments, the thermoplastic material of the second dielectric material is polypropylene. In an embodiment, the second dielectric material of each insulated conductor 512 of the edge conductor sets 510B may be a polypropylene-based resin.

In some embodiments, a thickness of the first dielectric material of each insulated conductor 512 of the edge conductor sets 510B is in a range from about 10 μm to about 100 μm. In other words, the thickness of the layer of the first dielectric material of each insulated conductor 512 of the edge conductor sets 510B is in a range from about 10 μm to about 100 μm. The thickness may refer to an average thickness of the layer of the first dielectric material. In some embodiments, the thickness of the first dielectric material is less than about 100 μm, 50 μm, 30 μm, or 20 μm.

In some embodiments, a thickness of the second dielectric material of each insulated conductor 512 of the edge conductor sets 510B is in a range from about 10 μm to about 100 μm. In other words, the thickness of the layer of the second dielectric material of each insulated conductor 512 of the edge conductor sets 510B is in a range from about 10 μm to about 100 μm. The thickness may refer to an average thickness of the layer of the second dielectric material. In some embodiments, the thickness of the second dielectric material is less than about 100 μm, 50 μm, 30 μm, or 20 μm.

In some embodiments, the thickness of the layer of the first dielectric material may be greater than the thickness of the layer of the second dielectric material. In other embodiments, the thickness of the layer of the first dielectric material may be less than or equal to the thickness of the layer of the second dielectric material.

Each insulated conductor 512 of each middle conductor set 510A may be not flame resistant. Further, the first dielectric material surrounding the central conductor 511 of each insulated conductor 512 of each middle conductor set 510A may be made of a polymeric material. In an embodiment, the first dielectric material of each middle conductor set 510A may be a polypropylene-based resin.

The flat electrical cable 504 further includes a first shielding layer 513 disposed on a top side of the cable 504, and a second shielding layer (not shown) disposed on a bottom side of the cable 504. The first shielding layer 513 and the second shielding layer are disposed around the conductor sets 510. Further, the first shielding layer 513 and the second shielding layer are generally parallel to each other and extend along the longitudinal axis "LC" of the cable 504. In an embodiment, the first shielding layer 513 and the second shielding layer are bonded to each other to form the longitudinal edges 509 of the cable 504. A conformable adhesive layer (not shown) may be disposed between the first shielding layer 513 and the second shielding layer, and bonds the first shielding layer 513 and the second shielding layer to each other on both sides of each conductor set 510. The first shielding layer 513 and the second shielding layer in combination at least partially enclose the plurality of conductor sets 510. In the illustrated embodiment of FIG. 5, the first shielding layer 513 includes a plurality of cover portions 517 and a plurality of pinched portions 523 disposed adjacent to the plurality of cover portions 517. Similarly, the second shielding layer includes a plurality of cover portions and a plurality of pinched portions disposed adjacent to the plurality of cover portions. The cover portions 517 and the pinched portions 523 are arranged such that, in a transverse cross-section, the cover portions 517 of the first shielding layer 513 and the cover portions of the second shielding layer in combination substantially surround the conductor sets 510. Further, the pinched portions 523 of the first shielding layer 513 and the pinched portions of the second shielding layer in combination form pinched portions of the cable 504 on each side of each conductor set 510. The adhesive layer may bond the first shielding layer 513 to the second shielding layer in each of the pinched portions 523 of the cable 504.

In one embodiment, the conductor sets 510 have a substantially curvilinear cross-sectional shape, and the first shielding layer 513 and the second shielding layer are disposed around the conductor sets 510 such as to substantially conform to and maintain the cross-sectional shape. Maintaining the cross-sectional shape maintains the electrical characteristics of the conductor sets 510 as intended in the design of conductor sets 510. In an embodiment, each of the first shielding layer 513 and the second shielding layer includes a conductive material. In some embodiments, the conductive material of the first shielding layer 513 and the second shielding layer includes aluminum. For example, the conductive material may be an aluminum alloy. In other embodiments, the conductive material of the first shielding layer 513 and the second shielding layer includes gold, silver, copper, and alloys thereof. In an embodiment, the flat electrical cable 504 further includes an insulative jacket (not shown) disposed around the first shielding layer 513 and the second shielding layer. The first shielding layer 513 and the second shielding may also act as primary flame barriers for the cable 504, and protect the conductor sets 510 from burning.

Upon burning, the intumescent flame retardant material of the first dielectric material may generate a microporous carbonaceous foam at the longitudinal edges 509 of the flat electrical cable 504. The carbonaceous foam may expand and get attached to the longitudinal edges 509 of the cable 504, and prevent the first shielding layer 513 and the second shielding layer (i.e., the primary flame barriers) from separating and exposing the conductor sets 510 to a flame. The intumescent carbonaceous microporous foam may therefore act as a flame barrier at the longitudinal edges 509 of the cable 504. In order to provide adequate flame resistance, the intumescent flame retardant material may be included in the insulated conductors 512 of each edge conductor set 510B, and not in the middle conductor sets 510A. In some embodiments, the intumescent flame retardant material may have low halogen content. In other embodiments, the intumescent flame retardant material may be halogen-free. The flat electrical cable 504 may therefore conform to certain industry standards or other specifications that require halogen-free materials as well as flame resistance.

Due to low halogen content of the intumescent flame retardant material, the dielectric properties of the first dielectric material of each edge conductor set 510B may be modified. Specifically, the dielectric properties of the first dielectric material of each edge conductor set 510B may be degraded due to the presence of the intumescent flame retardant material. Consequently, in some embodiments, the insulated conductors 512 of each edge conductor set 510B is used for low speed data transmission, power transmission, or ground connection. However, due to the absence of the flame retardant material in the insulated conductors 512 of each middle conductor set 510A, the middle conductor sets 510A can be used for high speed data transmission. It is to be noted that each insulated conductor 512 of each middle conductor set 510A may also be used for low speed data transmission, power transmission or ground connection. Specifically, each insulated conductor 512 of each middle conductor set 510A may also be used for transmitting low frequency signals. In some embodiments, low speed data transmission occurs in a signal frequency range from about 50 MHz to about 100 MHz. In some embodiments, high speed data transmission occurs in a signal frequency range from about 1 GHz to about 50 GHz.

As illustrated in FIG. 5, the circuit board 502 includes pluralities of first and second contact pad sets 518, 524 arranged in respective first and second rows 519, 525 along the opposing respective first and second edges 503, 505 of the circuit board 502. Further, the circuit board 502 includes pluralities of first and second contact pads 520, 526 arranged in the respective first and second rows 529, 525 along the opposing respective first and second edges 503, 505 of the circuit board 502.

The first connector portion 506 includes the plurality of first contact pad sets 518 arranged in the first row 519 along the first edge 503 of the circuit board 502. The first row 519 of first contact pad sets 518 extend between opposing ends 521. Specifically, the plurality of contact pad sets 518 are arranged along the transverse axis "TA" of the circuit board 502. Each first contact pad set 518 corresponds to a different conductor set 510 of the cable 504. Further, each first contact pad set 518 includes one or more first contact pads 520 (interchangeably referred to as "the contact pads 520"). The connector assembly 500 therefore includes the plurality of first contact pads 520 arranged in the first row 519. Further, the connector assembly 500 includes the plurality of first contact pad sets 518 arranged in the first row 519. In the illustrated embodiment of FIG. 5, each first contact pad set 518 includes two first contact pads 520. However, in other embodiments, each first contact pad set 518 may include any number of first contact pads 520. Each first contact pad 520 may be a conductive element that is printed on the circuit board 502. As shown in FIG. 5, the first connector portion 506 includes twelve first contact pad sets 518. However, the first connector portion 506 may include any number of first contact pad sets 518 as per application requirements. The plurality of first contact pad sets 518 includes a first middle contact pad set 518A disposed between two other first contact pad sets 518, and a first edge contact pad set 518B disposed at an end 521 of the first row 519. In other words, the plurality of first contact pads 520 include a plurality of first middle contact pads 520A disposed between a pair of first edge contact pads 520B disposed at opposing ends 521 of the row 519. In the illustrated embodiment of FIG. 5, the first connector portion 506 includes ten first middle contact pad sets 518A disposed between two first edge contact pad sets 518B. However, the first connector portion 506 may include any number of first contact pad sets 518 as per application requirements. Although the plurality of first contact pads 520 are depicted as being part of the circuit board 502, in various other embodiments, the plurality of first contact pads 520 may be part of an electrical connector. Similarly, the plurality of first contact pad sets 518 may be part of an electrical connector.

One or more of the first contact pad sets 518 and the respective first contact pads 520 may be configured for high speed data transmission. Further, other first contact pad sets 518 and the respective first contact pads 520 may be configured for low speed data transmission. As illustrated in FIG. 5, the first contact pad sets 518 designated as "HS" are configured for high speed data communication, while the first contact pad sets 518 designated as "LS" are configured for low speed data communication. In other words, the first contact pad sets 518 designated as "HS" may receive and/or transmit high frequency signals, and the first contact pad sets 518 designated as "LS" may receive and/or transmit low frequency signals. The first contact pad sets 518 configured for low speed data transmission may also be used for power transmission and ground connection. In some embodiments, low speed data transmission occurs in a signal frequency range from about 50 MHz to about 100 MHz. In some embodiments, high speed data transmission occurs in a signal frequency range from about 1 GHz to about 50 GHz. The first edge contact pad sets 518B and the respective first edge contact pads 520B are configured for low speed data transmission. Further, two of the first middle contact pad sets 518A and the respective first middle contact pads 520A are configured for low speed data transmission. Eight of the first middle contact pad sets 518A and the respective first middle contact pads 520A are configured for high speed data transmission. The arrangement of high speed and low speed first contact pad sets 518, as depicted in FIG. 5, are purely exemplary in nature, and alternative arrangements are possible within the scope of the disclosure. The cable 504 is connected to the first connector portion 506. In an embodiment, the arrangement of high speed and low speed first contact pad sets 518 of the first connector portion 506 may be chosen as per the configuration of the cable 504. Consequently, the insulated conductors 512 of the edge conductor sets 510B of the cable 504 may be connected to respective first edge contact pads 520B of the first edge contact pad sets 518B of the first connector portion 506. Similarly, the insulated conductors 512 of the middle conductor sets 510A of the cable 504 may be connected to respective first middle contact pads 520A of the first middle contact pad sets 518A of the first connector portion 506. The first contact pad sets 518 of the first connector portion 506 may have a similar arrangement in terms of data transmission speed as the conductor sets 510 of the cable 504. Therefore, the conductor sets 510 of the cable 504 may be interfaced with corresponding first contact pad sets 518 of the first connector portion 506 without any rerouting of the cable 504.

Since the middle conductor sets 510A can also be used for low speed data communication, insulated conductors 512 of one or more of the middle conductor sets 510 are terminated at respective first contact pads 520 that are adapted for low speed data communication.

The first connector portion 506 further includes a plurality of first ground pads 522 disposed adjacent to the first contact pad sets 518. The first ground pads 522 may be used for ground connection. In the illustrated embodiment of FIG. 5, one first ground pad 522 is provided on each side of three first contact pad sets 518, i.e., three first contact pad sets 518 are disposed between two first ground pads 522. Specifically, the first connector portion 506 includes five first ground pads 522. The number and arrangement of the first ground pads 522 may be chosen according to the configuration of the ground conductors 514 of the cable 504. Due to the presence of the first ground pads 522, the first edge contact pad sets 518B are located proximal to the respective ends 521 of the first row 519. The ground conductors 514 of the cable 504 are electrically connected to respective first ground pads 522 of the first connector portion 506. Specifically, the ground conductors 514 of the cable 504 are terminated at the respective first ground pads 522 of the first connector portion 506. Examples of termination methods may include soldering, welding, crimping, mechanical clamping, and adhesive bonding.

As illustrated in FIG. 5, the circuit board 502 includes multiple ground regions 515. The first ground pads 522 of the first connector portion 506 are electrically connected to respective ground regions 515. The first ground pads 522 may be electrically connected to the respective ground regions 515 by conductive members, such as wires. The ground regions 515 may form a ground plane of the circuit board 502. The circuit board 502 also includes intermediate regions 516 disposed between the ground regions 515. A number and a configuration of the intermediate regions 516 may depend on the configurations of the first and/or second connector portions 506, 508.

As illustrated in FIG. 5, each conductor set 510 of the cable 504 is connected to a respective first contact pad set 518 of the first connector portion 506. Specifically, the edge conductor sets 510B are connected to the respective first edge contact pad sets 518B, and the middle conductor sets 510A are connected to the respective first middle contact pad sets 518A. The insulated conductors 512 of the middle conductor set 510A of the cable 504 are terminated at the contact pads 520A of the first middle contact pad set 518A, and the insulated conductors 512 of the edge conductor set 510B of the cable 504 are terminated at the contact pads 520B of the first edge contact pad set 518B. The insulated conductors 512 of the edge conductor set 510B terminated at the contact pads 520B of the first edge contact pad 520B set are adapted for at least one of low speed data transmission, power transmission and ground connection. Further, the insulated conductors 512 of the middle conductor set 510A terminated at the contact pads 520A of the first middle contact pad set 518A are adapted for high speed data transmission.

As illustrated in FIG. 5, an insulated conductor 512 of the middle conductor set 510A of the cable 504 is terminated at a first middle contact pad 520A in the plurality of first middle contact pads 520A. Further, an insulated conductor 512 of the edge conductor set 510B of the cable 504 is terminated at a first edge contact pad 520B in the pair of first edge contact pads 520B. The insulated conductor 512 of the edge conductor set 510B terminated at the first edge contact pad 520B is adapted for at least one of low speed data transmission, power transmission and ground connection. Further, the insulated conductor 512 of the middle conductor set 510A terminated at the first middle contact pad 520A is adapted for high speed data transmission.

The conductor sets 510 of the cable 504 may be coupled to the respective first contact pad sets 518 by various methods. An end of the cable 504 facing the first connector portion 506 may be stripped and each insulated conductor 512 terminated at a respective first contact pad 520 of the first connector portion 506. Specifically, the central conductors 511 of the insulated conductors 512 are connected to respective first contact pads 520 of the first connector portion 506. For example, the first shielding layer 513 and the second shielding layer, and the layers of the first dielectric material of the insulated conductors 512 may be stripped at the end of the cable 504. The central conductors 511 of the insulated conductors 512 may then be aligned with the respective first contact pads 520. Ends of the central conductors 511 may then be terminated at the respective first contact pads 520. In case each insulated conductor 512 includes the layer of the second dielectric material, the layer of the second dielectric material may also be stripped at the end of the cable 504. Examples of termination methods may include soldering, welding, crimping, mechanical clamping, and adhesive bonding. In some embodiments, the ground conductors 514 may similarly be aligned and terminated at the respective first ground pads 522.

The second connector portion 508 includes the plurality of second contact pad sets 524 arranged in the second row 525. Specifically, the plurality of second contact pad sets 524 are arranged along the transverse axis "TA" of the circuit board 502. Each second contact pad set 524 corresponds to a different first contact pad set 518 in the plurality of first contact pad sets 518 of the first connector portion 506. Further, each second contact pad set 524 includes one or more second contact pads 526 (interchangeably referred to as "the contact pads 526"). In the illustrated embodiment of FIG. 5, each second contact pad set 524 includes two second contact pads 526. However, in other embodiments, each second contact pad set 524 may include any number of second contact pads 526. Each second contact pad 526 may be a conductive element that is printed on the circuit board 502. As shown in FIG. 5, the second connector portion 508 includes twelve second contact pad sets 524. However, the second connector portion 508 may include any number of second contact pad sets 524 as per application requirements.

The plurality of second contact pad sets 524 includes a second middle contact pad set 524A disposed between two other second contact pad sets 524 and a second edge contact pad set 524B disposed at an end of the second row 525. The plurality of second middle contact pad sets 524A are disposed between a pair of second edge contact pad sets 524B disposed at opposing ends 527 of the second row 525. In other words, the plurality of second contact pads 526 includes a plurality of second middle contact pads 526A disposed between a pair of second edge contact pads 526B disposed at the opposing ends 527 of the second row 525. In the illustrated embodiment of FIG. 5, the second connector portion 508 includes ten second middle contact pad sets 524A disposed between two second edge contact pad sets 524B. Although the plurality of second contact pads 526 are depicted as being part of the circuit board 502, in various other embodiments, the plurality of second contact pads 526 may be part of an electrical connector. Similarly, the plurality of second contact pad sets 524 may be part of an electrical connector.

One or more of the second contact pad sets 524 and the respective second contact pads 526 may be configured for high speed data transmission. Further, other second contact pad sets 524 and the respective second contact pads 526 may be configured for low speed data transmission. As illustrated in FIG. 5, the second contact pad sets 524 designated as "HS" are configured for high speed data communication, while the second contact pad sets 524 designated as "LS" are configured for low speed data communication. In other words, the second contact pad sets 524 designated as "HS" may receive and/or transmit high frequency signals. The second contact pad sets 524 designated as "LS" may receive and/or transmit low frequency signals. The second contact pad sets 524 configured for low speed data transmission may also be used for power transmission/reception and ground connection. In some embodiments, low speed data transmission occurs in a signal frequency range from about 50 MHz to about 100 MHz. In some embodiments, high speed data transmission occurs in a signal frequency range from about 1 GHz to about 50 GHz. The second edge contact pad sets 524B and the respective second edge contact pads 526B are configured for low speed data transmission. Further, four of the second middle contact pad sets 524A and the respective second middle contact pads 526A are configured for low speed data transmission. Six of the second middle contact pad sets 524A and the respective second middle contact pads 526A are configured for high speed data transmission. The arrangement of high speed and low speed second contact pad sets 524, as depicted in FIG. 5, are purely exemplary in nature, and alternative arrangements are possible within the scope of the disclosure.

The second contact pad sets 524 of the second connector portion 508 may conform to certain industry standards, such as peripheral component interconnect express (PCIe). The second contact pad sets 524 may further form a pinout of an integrated circuit (IC), such as a chip. The arrangement of high speed and low speed second contact pad sets 524 may have to conform to the pinout configuration of the IC, and may be not modified as per the configuration of the cable 504. For example, the second edge contact pad sets 524B and the respective second edge contact pads 526B may be used for high speed data communication. However, each insulated conductor 512 of the edge conductor sets 510B of the cable 504 are adapted for at least one of low speed data transmission, power transmission and ground connection. Consequently, each insulated conductor 512 of the edge conductor sets 510B may be not electrically connected to the respective second edge contact pads 526B of the second edge contact pad sets 524B. The first connector portion 506 may act as an intermediary between the cable 504 and the second connector portion 508, such that the conductor sets 510 of the cable 504 may be electrically connected with respective second contact pad sets 524 without rerouting of the cable 504. Instead, the first contact pad sets 518 of the first connector portion 506 may be electrically connected with appropriate second contact pad sets 524 of the second connector portion 508 based on data transmission speeds of individual first and second contact pad sets 518, 524.

As illustrated in FIG. 5, a plurality of conductive trace sets 530 of the circuit board 502 electrically connect the first contact pad sets 518 of the first connector portion 506 to the respective second contact pad sets 524 of the second connector portion 508. Each conductive trace set 530 includes a pair of conductive traces 532. However, a number of conductive traces 532 of each conductive trace set 530 may depend on the configurations of the first and second connector portions 506, 508. The conductive traces 532 may be electrically conductive paths along the circuit board 502. The conductive traces 532 may be formed by printing or etching on the circuit board 502. Further, the conductive trace sets 530 may be disposed in respective intermediate regions 516 of the circuit board 502. The shape of each conductive trace 532, as shown in FIG. 5, is exemplary in nature and alternative shapes are possible within the scope of the present disclosure.

Due to the difference in configuration between the first connector portion 506 and the second connector portion 508, one or more conductive trace sets 530 may have a crossed configuration. A pair of first conductive traces 532A of the circuit board 502 connect the contact pads 520A of the first middle contact pad set 518A to the contact pads 526B of the second edge contact pad set 524B. Further, a pair of second conductive traces 532B of the circuit board 502 connect the contact pads 520B of the first edge contact pad set 518B to the contact pads 526A of the second middle contact pad set 524A. In other words, a first conductive trace 532A of the circuit board 502 connects a first middle contact pad 520A in the plurality of first middle contact pads 520A to a second edge contact pad 526B in the pair of second edge contact pads 526B. Further, a second conductive trace 532B of the circuit board 502 connects a first edge contact pad 520B in the pair of first edge contact pads 520B to a second middle contact pad 526A in the plurality of second middle contact pads 526A.

As illustrated in FIG. 5, two pairs of first conductive traces 532A electrically connect the respective first middle contact pad sets 518A to the respective second edge contact pad sets 524B. The first middle contact pad sets 518A, that are connected to the respective pairs of first conductive traces 532A, are located adjacent to the respective first edge contact pad sets 518B of the first connector portion 506. The insulated conductors 512 of the two middle conductor sets 510A, that are located adjacent to the respective edge conductor sets 510B of the cable 504, may therefore be electrically connected to the respective second edge contact pad sets 524B via the respective first middle contact pad sets 518A and the respective pairs of first conductive traces 532A. Further, two pairs of second conductive traces 532B electrically connect the respective first edge contact pad sets 518B to the respective second middle contact pad sets 524A. The second middle contact pad sets 524A, that are connected to the respective pairs of second conductive traces 532B, are the third second contact pad sets 524 from the respective ends 527 of the second row 525. The insulated conductors 512 of the two edge conductor sets 510B may therefore be electrically connected to the respective second middle contact pad sets 524A via the respective first edge contact pad sets 518B and the respective pairs of second conductive traces 532B.

As illustrated in FIG. 5, two pairs of third conductive traces 532C electrically connect two first middle contact pad sets 518A to two second middle contact pad sets 524A in a crossed configuration. Specifically, the first middle contact pad sets 518A, that are the third first contact pad sets 518 from the respective ends 521 of the first row 519, are connected by the respective pairs of third conductive traces 532C to the respective second middle contact pad sets 524A that are located adjacent to the respective second edge contact pad sets 524B of the second connector portion 508.

The circuit board 502 may therefore include the first, second and third conductive traces 532A, 532B, 532C for electrically connecting the respective first and second contact pad sets 518, 524 that are offset from each other with respect to the transverse axis "TA" of the circuit board 502. This may enable the conductor sets 510 of the cable 504 to be electrically connected to the respective second contact pad sets 524 of the second connector portion 508 based on data transmission speed. For example, the edge conductor sets 510B that are adapted for low speed data transmission may be electrically connected to the respective second middle contact pad sets 524A that are also adapted for low speed data transmission. Further, two middle conductor sets 510A that are adapted for high speed data transmission may be electrically connected to the respective second edge contact pad sets 524B that are also adapted for high speed data transmission.

The first contact pad sets 518 connected to the respective first, second and third conductive traces 532A, 532B, 532C may belong to two groups of adjacent first contact pad sets 518 located proximal to respective ends 521 of the first row 519. Similarly, the second contact pad sets 524 connected to the respective first, second and third conductive traces 532A, 532B, 532C belong to two groups of adjacent second contact pad sets 524 located proximal to respective ends 527 of the second row 525. The first, second and third conductive traces 532A, 532B, 532C may have one or more bends in order to connect the respective first and second contact pad sets 518, 524 to each other. The first, second and third conductive traces 532A, 532B, 532C may also be located in different planes (e.g., a multilayer printed circuit board may be used and the first, second and third conductive traces 532A, 532B, 532C may be formed in two or three different conductive layers of the circuit board).

The second connector portion 508 further includes a plurality of second ground pads 528 disposed adjacent to the second contact pad sets 524. In the illustrated embodiment of FIG. 5, the second ground pads 528 and the second contact pad sets 524 are provided alternately along the second row 525, such that each second contact pad set 524 is disposed between two second ground pads 528. The second connector portion 508 includes thirteen second ground pads 528. However, any number and arrangement of the second ground pads 528 may be provided based on application requirements, such as an industry standard. Due to the presence of the second ground pads 528, the second edge contact pad sets 524B and the corresponding second edge contact pads 526B are located proximal to the respective ends 527 of the second row 525. Each second ground pad 528 is adapted for ground connection. The second ground pads 528 of the second connector portion 508 may be electrically connected to respective ground regions 515 of the circuit board 502. The second ground pads 528 may be electrically connected to the respective ground regions 515 by conductive members, such as wires.

The cable 504 may therefore be used with a standard pinout without any modifications, while conforming to industry standards or other specifications that require halogen-free materials as well as flame resistance. Specifically, the intumescent flame retardant material provided in the insulated conductors 512 of the edge conductor sets 510B may provide adequate flame resistance, while being substantially free of any halogens. The first connector portion 506 may allow the cable 504 to be used with a standard pinout (for example, the second connector portion 508) where the edge contact pad sets are configured for high speed data transmission/reception.

Figure 6:
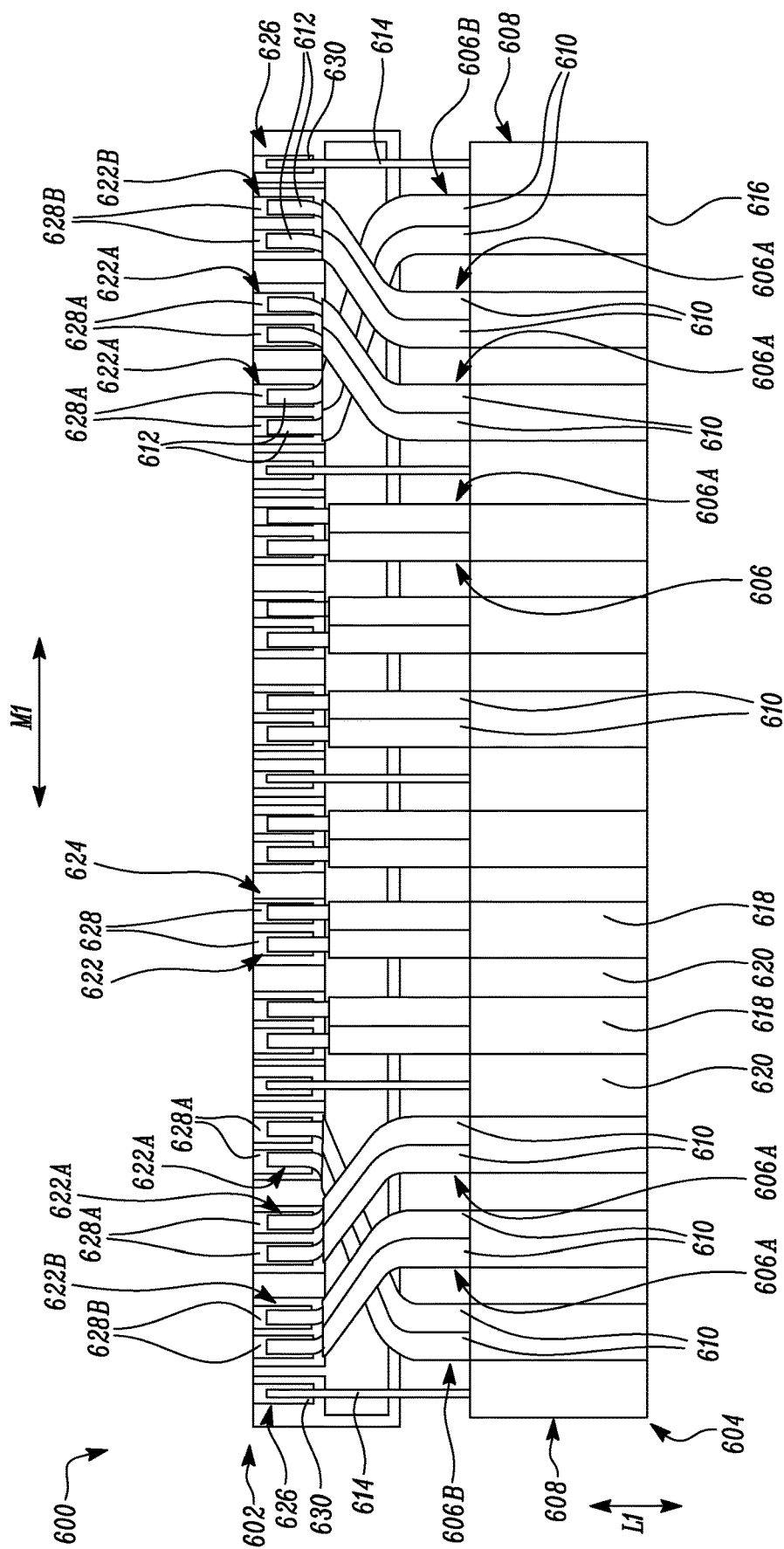
FIG. 6 is a schematic top view of a connector assembly according another embodiment of the present disclosure.

FIG. 6 illustrates a connector assembly 600. The connector assembly 600 may be used with any electrical product or device. The connector assembly 600 includes a connector 602 and a flat electrical cable 604. The flat electrical cable 604 is electrically connected to the first connector 602. The connector 602 may be part of a PCB.

The flat electrical cable 604 (interchangeably referred to as "the cable 604") is substantially similar to the cable 100, as shown in FIGS. 1 and 2. The flat electrical cable 604 is partially shown in FIG. 6. The flat electrical cable 604 extends along a length of the cable 604. Specifically, the flat electrical cable 604 extends along a longitudinal axis "L1" of the cable 604. Similar to the cable 100, the flat electrical cable 604 includes a plurality of conductor sets 606 extending along the length of the cable 604. In the illustrated embodiment of FIG. 6, the conductor sets 606 extend generally along the longitudinal axis "L1" of the cable 604. The cable 604 further includes longitudinal edges 608 on both sides of the cable 604. The longitudinal edges 608 extend generally along the length of the cable 604. Specifically, the longitudinal edges 608 extend generally along the longitudinal axis "L1" of the cable 604. Each conductor set 606 includes one or more insulated electrical conductors 610 (hereinafter referred to as "the insulated conductors 610"). In the illustrated embodiment of FIG. 6, each conductor set 606 includes two insulated conductors 610. However, each conductor set 606 may include any number of insulated conductors 610 based on the configuration of the connector 602. Each insulated conductor 610 includes a central conductor 612 surrounded by a first dielectric material. Specifically, the central conductor 612 of each insulated conductor 610 of each conductor set 606 is surrounded by a layer of the first dielectric material. The plurality of conductor sets 606 further includes a middle conductor set 606A disposed between two other conductor sets 606, and an edge conductor set 606B disposed proximal to the longitudinal edge 608 of the cable 604. As illustrated in FIG. 6, the flat electrical cable 604 includes two edge conductor sets 606B disposed proximal to respective longitudinal edges 608 of the cable 604. Further, the flat electrical cable 604 includes multiple middle conductor sets 606A disposed between the edge conductor sets 606B. Each middle conductor set 606A is disposed between either two other middle conductor sets 606A, or another middle conductor set 606A and one edge conductor set 606B. In the illustrated embodiment of FIG. 6, the flat electric cable 604 includes ten middle conductor sets 606A disposed between the two edge conductor sets 606B. However, in alternative configurations, the cable 604 may include any number of middle conductor sets 606A disposed between two edge conductor sets 606B based on the configurations of the connector 602.

Further, a ground conductor 614 is disposed between the edge conductor set 606B and the longitudinal edge 608 of the cable 604. Specifically, one ground conductor 614 is disposed between each edge conductor set 606B and the respective longitudinal edge 608 of the cable 604. In the embodiment illustrated in FIG. 6, the cable 604 includes multiple ground conductors 614. Specifically, one ground conductor 614 is provided on each side of three conductor sets 606, i.e., three conductor sets 606 are disposed between two ground conductors 614. Therefore, the flat electric cable 604 includes five ground conductors 614. However, any suitable number of ground conductors 614 may be provided. The ground conductors 614 may include ground wires or drain wires. The ground conductors 614 are spaced apart from and extend in substantially the same direction as the insulated conductors 610.

In an embodiment, the first dielectric material of each insulated conductor 610 of the edge, but not the middle, conductor set 606B includes an intumescent flame retardant material. In other words, the layer of the first dielectric material of each insulated conductor 610 of each edge conductor set 606B includes the intumescent flame retardant material. However, the layer of the first dielectric material of each insulated conductor 610 of each middle conductor set 606A is devoid of any intumescent flame retardant material. The first dielectric material of each insulated conductor 610 of each edge conductor set 606B surrounds the corresponding central conductor 612. In some embodiments, each insulated conductor 610 of the edge conductor set 606B further includes an optional second dielectric material (not shown) disposed between the central conductor 612 and the first dielectric material. The second dielectric material is devoid of the intumescent flame retardant material. In other words, each insulated conductor 610 of each edge conductor set 606B may include an inner layer of the second dielectric material surrounding the corresponding central conductor 612, and an outer layer of the first dielectric material surrounding the inner layer. The inner layer is devoid of the intumescent flame retardant material, while the outer layer includes the intumescent flame retardant material.

In some embodiments, the intumescent flame retardant material of the first dielectric material includes magnesium oxide (MgO). In some embodiments, the first dielectric material includes about 20% to about 35% by weight of the intumescent flame retardant material in a polymeric substrate. In some embodiments, the first dielectric material of each insulated conductor 610 of each edge conductor set 606B includes at least 20% magnesium oxide by weight. In some embodiments, the first dielectric material of each insulated conductor 610 of the edge conductor sets 606B includes about 50% to about 65% magnesium oxide by weight. In other embodiments, the first dielectric material includes at least 30%, 35%, 50%, 70%, 80%, 90%, 95%, 98%, or 99% magnesium oxide by weight. In another embodiment, the intumescent flame retardant material includes alumina trihydrate. In some embodiments, the first dielectric material of each insulated conductor 610 of the edge conductor sets 606B further includes a thermoplastic material. In a further embodiment, the thermoplastic material of the first dielectric material is polypropylene. In some embodiments, the first dielectric material of each insulated conductor 610 of the edge conductor sets 606B may be a polypropylene-based, zero halogen, flame retardant material. Each insulated conductor 610 of the edge conductor sets 606B may therefore be an IFR polypropylene insulated conductor or wire.

In some embodiments, the second dielectric material includes a thermoplastic material. In some embodiments, the thermoplastic material of the second dielectric material is polypropylene. In an embodiment, the second dielectric material of each insulated conductor 610 of the edge conductor sets 606B may be a polypropylene-based resin.

In some embodiments, a thickness of the first dielectric material of each insulated conductor 610 of the edge conductor sets 606B is in a range from about 10 μm to about 100 μm. In other words, the thickness of the layer of the first dielectric material of each insulated conductor 610 of the edge conductor sets 606B is in a range from about 10 μm to about 100 μm. The thickness may refer to an average thickness of the layer of the first dielectric material. In some embodiments, the thickness of the first dielectric material is less than about 100 μm, 50 μm, 30 μm, or 20 μm.

In some embodiments, a thickness of the second dielectric material of each insulated conductor 610 of the edge conductor sets 606B is in a range from about 10 μm to about 100 μm. In other words, the thickness of the layer of the second dielectric material of each insulated conductor 610 of the edge conductor sets 606B is in a range from about 10 μm to about 100 μm. The thickness may refer to an average thickness of the layer of the second dielectric material. In some embodiments, the thickness of the second dielectric material is less than about 100 μm, 50 μm, 30 μm, or 20 μm.

In some embodiments, the thickness of the layer of the first dielectric material may be greater than the thickness of the layer of the second dielectric material. In other embodiments, the thickness of the layer of the first dielectric material may be less than or equal to the thickness of the layer of the second dielectric material.

Each insulated conductor 610 of each middle conductor set 606A may be not flame resistant. Further, the first dielectric material surrounding the central conductor 612 of each insulated conductor 610 of each middle conductor set 606A may be made of a polymeric material. In an embodiment, the first dielectric material of each middle conductor set 606A may be a polypropylene-based resin.

The flat electrical cable 604 further includes a first shielding layer 616 disposed on a top side of the cable 604, and a second shielding layer (not shown) disposed on a bottom side of the cable 604. The first shielding layer 616 and the second shielding layer are disposed around the conductor sets 606. Further, the first shielding layer 616 and the second shielding layer are generally parallel to each other and extend along the longitudinal axis "L1" of the cable 604. In an embodiment, the first shielding layer 616 and the second shielding layer are bonded to each other to form the longitudinal edges 608 of the cable 604. A conformable adhesive layer (not shown) may be disposed between the first shielding layer 616 and the second shielding layer, and bonds the first shielding layer 616 and the second shielding layer to each other on both sides of each conductor set 606. The first shielding layer 616 and the second shielding layer in combination at least partially enclose the plurality of conductor sets 606. In the illustrated embodiment of FIG. 6, the first shielding layer 616 includes a plurality of cover portions 618 and a plurality of pinched portions 620 disposed adjacent to the plurality of cover portions 618. Similarly, the second shielding layer includes a plurality of cover portions and a plurality of pinched portions disposed adjacent to the plurality of cover portions. The cover portions 618 and the pinched portions 620 are arranged such that, in a transverse cross-section, the cover portions 618 of the first shielding layer 616 and the cover portions of the second shielding layer in combination substantially surround the conductor sets 606. Further, the pinched portions 620 of the first shielding layer 616 and the pinched portions of the second shielding layer in combination form pinched portions of the cable 604 on each side of each conductor set 606. The adhesive layer may bond the first shielding layer 616 to the second shielding layer in each of the pinched portions 620 of the cable 604.

In one embodiment, the conductor sets 606 have a substantially curvilinear cross-sectional shape, and the first shielding layer 616 and the second shielding layer are disposed around the conductor sets 606 such as to substantially conform to and maintain the cross-sectional shape. Maintaining the cross-sectional shape maintains the electrical characteristics of the conductor sets 606 as intended in the design of conductor sets 606. In an embodiment, each of the first shielding layer 616 and the second shielding layer includes a conductive material. In some embodiments, the conductive material of the first shielding layer 616 and the second shielding layer includes aluminum. For example, the conductive material may be an aluminum alloy. In other embodiments, the conductive material of the first shielding layer 616 and the second shielding layer includes gold, silver, copper, and alloys thereof. In an embodiment, the flat electrical cable 604 further includes an insulative jacket (not shown) disposed around the first shielding layer 616 and the second shielding layer. The first shielding layer 616 and the second shielding may also act as primary flame barriers for the cable 604, and protect the conductor sets 606 from burning.

Upon burning, the intumescent flame retardant material of the first dielectric material may generate a microporous carbonaceous foam at the longitudinal edges 608 of the flat electrical cable 604. The carbonaceous foam may expand and get attached to the longitudinal edges 608 of the cable 604, and prevent the first shielding layer 616 and the second shielding layer (i.e., the primary flame barriers) from separating and exposing the conductor sets 606 to a flame. The intumescent carbonaceous microporous foam may therefore act as a flame barrier at the longitudinal edges 608 of the cable 604. In order to provide adequate flame resistance, the intumescent flame retardant material may be included in the insulated conductors 610 of each edge conductor set 606B, and not in the middle conductor sets 606A. In some embodiments, the intumescent flame retardant material may have low halogen content. In other embodiments, the intumescent flame retardant material may be halogen-free. The flat electrical cable 604 may therefore conform to certain industry standards or other specifications that require halogen-free materials as well as flame resistance.

Due to low halogen content of the intumescent flame retardant material, the dielectric properties of the first dielectric material of each edge conductor set 606B may be modified. Specifically, the dielectric properties of the first dielectric material of each edge conductor set 606B may be degraded due to the presence of the intumescent flame retardant material. Consequently, in some embodiments, the insulated conductors 610 of each edge conductor set 606B is used for low speed data transmission, power transmission, or ground connection. However, due to the absence of the flame retardant material in the insulated conductors 610 of each middle conductor set 606A, the middle conductor sets 606A can be used for high speed data transmission. It is to be noted that each insulated conductor 610 of each middle conductor set 606A may also be used for low speed data transmission, power transmission or ground connection. Specifically, each insulated conductor 610 of each middle conductor set 606A may also be used for transmitting low frequency signals. In some embodiments, low speed data transmission occurs in a signal frequency range from about 50 MHz to about 100 MHz. In some embodiments, high speed data transmission occurs in a signal frequency range from about 1 GHz to about 50 GHz.

The connector 602 includes a plurality of contact pad sets 622 arranged in a row 624. The row 624 is disposed along a main axis "M1" of the connector 602. The row 624 extends between opposing ends 626 with respect to the main axis "M1" of the connector 602. The plurality of contact pad sets 622 may be therefore arranged along the main axis "M1" of the connector 602. Each contact pad set 622 corresponds to a different conductor set 606 of the cable 604. Further, each contact pad set 622 includes one or more contact pads 628. The connector assembly 600 therefore includes the plurality of contact pads 628 arranged in the row 624. Further, the connector assembly 600 includes the plurality of contact pad sets 622 arranged in the row 624. In the illustrated embodiment of FIG. 6, each contact pad set 622 includes two contact pads 628. However, in other embodiments, each contact pad set 622 may include any number of contact pads 628. Each contact pad 628 may be a conductive element. As shown in FIG. 6, the connector 602 includes twelve contact pad sets 622. However, the connector 602 may include any number of contact pad sets 622 as per application requirements. The plurality of contact pad sets 622 includes a middle contact pad set 622A disposed between two other contact pad sets 622, and an edge contact pad set 622B disposed at an end 626 of the row 624. In other words, the plurality of contact pads 628 include a plurality of middle contact pads 628A disposed between a pair of edge contact pads 628B disposed at the opposing ends 626 of the row 624. In the illustrated embodiment of FIG. 6, the connector 602 includes ten middle contact pad sets 622A disposed between two edge contact pad sets 622B. Although the plurality of contact pads 628 are depicted as being part of the connector 602, in various other embodiments, the plurality of contact pads 628 may be part of at least one of a printed circuit board and an electrical connector. Similarly, the plurality of contact pad sets 622 may be part of at least one of a printed circuit board and an electrical connector.

One or more of the contact pad sets 622 and the respective contact pads 628 may be configured for high speed data transmission. Further, other contact pad sets 622 and the respective contact pads 628 may be configured for low speed data transmission. As illustrated in FIG. 6, the contact pad sets 622 designated as "HS" are configured for high speed data communication, while the contact pad sets 622 designated as "LS" are configured for low speed data communication. In other words, the contact pad sets 622 designated as "HS" may receive and/or transmit high frequency signals, and the contact pad sets 622 designated as "LS" may receive and/or transmit low frequency signals. The contact pad sets 622 configured for low speed data transmission may also be used for power transmission and ground connection. In some embodiments, low speed data transmission occurs in a signal frequency range from about 50 MHz to about 100 MHz. In some embodiments, high speed data transmission occurs in a signal frequency range from about 1 GHz to about 50 GHz. The edge contact pad sets 622B and the respective edge contact pads 628B are configured for high speed data transmission. Further, four of the middle contact pad sets 622A and the respective middle contact pads 628A are configured for low speed data transmission. Six of the middle contact pad sets 622A and the respective middle contact pads 628A are configured for high speed data transmission. The arrangement of high speed and low speed contact pad sets 622, as depicted in FIG. 6, are purely exemplary in nature, and alternative arrangements are possible within the scope of the disclosure. The contact pad sets 622 of the connector 602 may conform to certain industry standards, such as peripheral component interconnect express (PCIe). The contact pad sets 622 may further form a pinout of an integrated circuit (IC), such as a chip. The arrangement of high speed and low speed contact pad sets 622 may have to conform to the pinout configuration of the IC, and may be not modified as per the configuration of the cable 604. For example, the edge contact pad sets 622B and the respective edge contact pads 628B may be used for high speed data communication. However, each insulated conductor 610 of the edge conductor sets 606B of the cable 604 are adapted for at least one of low speed data transmission, power transmission and ground connection. Consequently, each insulated conductor 610 of the edge conductor sets 606B may be not terminated at the respective edge contact pads 628B of the edge contact pad sets 622B. Each edge conductor set 606B may have to be rerouted and terminated at a middle contact pad set 622A which is adapted for low speed data communication.

The connector 602 further includes a plurality of ground pads 630 disposed adjacent to the contact pad sets 622. In the illustrated embodiment of FIG. 6, one ground pad 630 is provided on each side of three contact pad sets 622, i.e., three contact pad sets 622 are disposed between two ground pads 630. Specifically, the connector 602 includes five ground pads 630. The number and arrangement of the ground pads 630 may be based on application requirements, for example, an industry standard. The ground pads 630 may be conductive elements used for ground connection, and may be connected to a ground plane of a PCB. Due to the presence of the ground pads 630, the edge contact pad sets 622B are located proximal to the respective ends 626 of the row 624. One end of each ground conductor 614 may be terminated at a respective ground pad 630 of the connector 602.

Due to the difference in configuration between the cable 604 and the connector 602, rerouting of some of the conductor sets 606 may be required. In some embodiments, the insulated conductors 610 of the edge conductor set 606B are terminated at the contact pads 628A of the middle contact pad set 622A, and the insulated conductors 610 of the middle conductor set 606A are terminated at the contact pads 628B of the edge contact pad set 622B. In other words, an insulated conductor 610 of the edge conductor set 606B is terminated at a middle contact pad 628A, and an insulated conductor 610 of the middle conductor set 606A is terminated at an edge contact pad 628B. The insulated conductor 610 of the edge conductor set 606B terminated at the middle contact pad 628A is adapted for at least one of low speed data transmission, power transmission and ground connection. Further, the insulated conductor 610 of the middle conductor set 606A terminated at the edge contact pad 628B is adapted for high speed data transmission. The insulated conductors 610 of the edge conductor set 606B terminated at the contact pads 628A of the middle contact pad set 622A set are adapted for at least one of low speed data transmission, power transmission and ground connection. Further, the insulated conductors 610 of the middle conductor set 606A terminated at the contact pads 628B of the edge contact pad set 622B are adapted for high speed data transmission.

An end of the cable 604 facing the connector 602 may be stripped and each insulated conductor 610 terminated at a respective contact pad 628 of the connector 602. For example, the first shielding layer 616 and the second shielding layer, and the layers of first dielectric material of the insulated conductors 610 may be stripped at the end of the cable 604. The central conductors 612 of the insulated conductors 610 may then be aligned with the respective contact pads 628. Ends of the central conductors 612 may then be terminated at the respective contact pads 628. In case each insulated conductor 610 includes the layer of the second dielectric material, the layer of the second dielectric material may also be stripped at the end of the cable 604. Examples of termination methods may include soldering, welding, crimping, mechanical clamping, and adhesive bonding. In some embodiments, the ground conductors 614 may similarly be aligned and terminated at the respective ground pads 630.

As shown in FIG. 6, each insulated conductor 610 of each edge conductor set 606B is rerouted and terminated at the respective middle contact pad 628A of the middle contact pad set 622A that is adapted for low speed data communication and is nearest to the respective end 626 of the row 624. Each edge conductor set 606B may be connected to the third middle contact pad set 622A from the respective end 626 of the row 624. Further, the insulated conductors 610 of each middle conductor set 606A that is adjacent to each edge conductor set 606B are rerouted and terminated at the respective edge contact pads 628B of the respective edge contact pad set 622B. Therefore, the two middle conductor sets 606A located adjacent to the respective edge conductor sets 606B are rerouted and connected to the respective edge contact pad sets 622B. Moreover, the insulated conductors 610 of the second middle conductor set 606A (i.e., the third conductor set 606) from each longitudinal edge 608 of the cable 604 are also rerouted and terminated at the respective middle contact pads 628A of the middle contact pad set 622A that is adapted for high speed communication and is disposed adjacent to the respective edge contact pad set 622B. In the illustrated embodiment of FIG. 6, the two edge conductor sets 606B and four middle conductor sets 606A are rerouted. Due to rerouting, the insulated conductors 610 of the edge conductor sets 606B and the four middle conductor sets 606A may be bent at one or more locations. The number of bends, as shown in FIG. 6, are purely exemplary, and the rerouting may be achieved in any suitable manner. The edge conductor set 606B and the two adjacent middle conductor sets 606A proximal to each longitudinal edge 608 of the cable 604 may be disposed at different planes due to rerouting. Further, the edge conductor set 606B at each longitudinal edge 608 may intersect the two adjacent middle conductor sets 606A.

Since the middle conductor sets 606A can also be used for low speed data communication, insulated conductors 610 of one or more of the middle conductor sets 606A are terminated at respective contact pads 628 that are adapted for low speed data communication.

The cable 604 may therefore be used with a standard pinout without any modifications, while conforming to industry standards or other specifications that require halogen-free materials as well as flame resistance. Specifically, the intumescent flame retardant material provided in the insulated conductors 610 of the edge conductor sets 606B may provide adequate flame resistance, while being substantially free of any halogens. Rerouting of the edge conductor sets 606B and one or more of the middle conductor sets 606A may also enable the cable 604 to be used with a standard pinout where the edge contact pad sets are configured for high speed data transmission/reception.

Unless otherwise indicated, all numbers expressing feature sizes, amounts, and physical properties used in the specification and claims are to be understood as being modified by the term "about". Accordingly, unless indicated to the contrary, the numerical parameters set forth in the foregoing specification and attached claims are approximations that can vary depending upon the desired properties sought to be obtained by those skilled in the art utilizing the teachings disclosed herein.

Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A flat electrical cable extending longitudinally along a length of the cable, comprising a plurality of conductor sets extending along the length of the cable, each conductor set comprising one or more insulated electrical conductors, each insulated conductor comprising a central conductor surrounded by a first dielectric material, the plurality of conductor sets comprising a middle conductor set disposed between two other conductor sets and an edge conductor set disposed proximal to a longitudinal edge of the cable, wherein the first dielectric material of each insulated conductor of the edge, but not the middle, conductor set comprises an intumescent flame retardant material.

2. A connector assembly comprising:
a plurality of contact pads arranged in a row and comprising a plurality of middle contact pads disposed between a pair of edge contact pads disposed at opposing ends of the row; and
the flat electrical cable of claim 1, wherein an insulated conductor of the edge conductor set is terminated at a middle contact pad, and an insulated conductor of the middle conductor set is terminated at an edge contact pad, wherein the plurality of contact pads are part of at least one of a printed circuit board and an electrical connector.

3. A connector assembly comprising:
the flat electrical cable of claim 1; and
a circuit board comprising pluralities of first and second contact pads arranged in respective first and second rows along opposing respective first and second edges of the circuit board, the plurality of first contact pads comprising a plurality of first middle contact pads disposed between a pair of first edge contact pads disposed at opposing ends of the first row, wherein an insulated conductor of the middle conductor set of the cable is terminated at a first middle contact pad in the plurality of first middle contact pads, and an insulated conductor of the edge conductor set of the cable is terminated at a first edge contact pad in the pair of first edge contact pads, the plurality of second contact pads comprising a plurality of second middle contact pads disposed between a pair of second edge contact pads disposed at opposing ends of the second row, wherein a first conductive trace of the circuit board connects a first middle contact pad in the plurality of first middle contact pads to a second edge contact pad in the pair of second edge contact pads, and a second conductive trace of the circuit board connects a first edge contact pad in the pair of first edge contact pads to a second middle contact pad in the plurality of second middle contact pads.

4. A connector assembly comprising:
the flat electrical cable of claim 1; and
a circuit board comprising pluralities of first and second contact pad sets arranged in respective first and second rows along opposing respective first and second edges of the circuit board, each first contact pad set corresponding to a different conductor set of the cable and comprising one or more contact pads, each second contact pad set corresponding to a different first contact pad set in the plurality of first contact pad sets and comprising one or more contact pads, the plurality of first contact pad sets comprising a first middle contact pad set disposed between two other first contact pad sets and a first edge contact pad set disposed at an end of the first row, wherein the insulated conductors of the middle conductor set of the cable are terminated at the contact pads of the first middle contact pad set, and the insulated conductors of the edge conductor set of the cable are terminated at the contact pads of the first edge contact pad set, the plurality of second contact pad sets comprising a second middle contact pad set disposed between two other second contact pad sets and a second edge contact pad set disposed at an end of the second row, wherein a pair of first conductive traces of the circuit board connect the contact pads of the first middle contact pad set to the contact pads of the second edge contact pad set, and a pair of second conductive traces of the circuit board connect the contact pads of the first edge contact pad set to the contact pads of the second middle contact pad set.

5. The flat electrical cable of claim 1, wherein each insulated conductor of the edge conductor set further comprises a second dielectric material disposed between the central conductor and the first dielectric material, the second dielectric material being devoid of the intumescent flame retardant material.

6. A connector assembly comprising:
a flat electrical cable extending longitudinally along a length of the cable, comprising a plurality of conductor sets extending along the length of the cable, each conductor set comprising one or more insulated electrical conductors, each insulated conductor comprising a central conductor surrounded by a first dielectric material, the plurality of conductor sets comprising a middle conductor set disposed between two other conductor sets and an edge conductor set disposed proximal to a longitudinal edge of the cable, wherein the first dielectric material of each insulated conductor of the edge, but not the middle, conductor set comprises an intumescent flame retardant material; and
a plurality of contact pads arranged in a row and comprising a plurality of middle contact pads disposed between a pair of edge contact pads disposed at opposing ends of the row; wherein an insulated conductor of the edge conductor set is terminated at a middle contact pad, and an insulated conductor of the middle conductor set is terminated at an edge contact pad.

7. The connector assembly of claim 6, wherein:
the insulated conductor of the edge conductor set terminated at the middle contact pad is adapted for at least one of low speed data transmission, power transmission and ground connection; and
the insulated conductor of the middle conductor set terminated at the edge contact pad is adapted for high speed data transmission, wherein low speed data transmission occurs in a signal frequency range from about 50 MHz to about 100 MHz, wherein high speed data transmission occurs in a signal frequency range from about 1 GHz to about 50 GHz, and wherein the intumescent flame retardant material comprises magnesium oxide.

8. The connector assembly of claim 6, further comprising:
a first shielding layer disposed on a top side of the cable; and
a second shielding layer disposed on a bottom side of the cable, wherein the first shielding layer and the second shielding layer are bonded to each other to form the longitudinal edge of the cable, and wherein the first shielding layer and the second shielding layer in combination at least partially enclose the plurality of conductor sets, wherein each of the first shielding layer and the second shielding layer comprises a conductive material.

9. A flat electrical cable extending longitudinally along a length of the cable, comprising a plurality of conductor sets extending along the length of the cable, each conductor set comprising one or more insulated electrical conductors, each insulated conductor comprising a central conductor surrounded by a first dielectric material, the plurality of conductor sets comprising a middle conductor set disposed between two other conductor sets and an edge conductor set disposed proximal to a longitudinal edge of the cable, wherein the first dielectric material of each insulated conductor of the edge, but not the middle, conductor set comprises an intumescent flame retardant material, and wherein each insulated conductor of the edge conductor set further comprises a second dielectric material disposed between the central conductor and the first dielectric material, the second dielectric material being devoid of the intumescent flame retardant material.

10. The flat electrical cable of claim 9, wherein the intumescent flame retardant material comprises magnesium oxide, and wherein the first dielectric material of each insulated conductor of the edge conductor set comprises at least 20% magnesium oxide by weight.

11. The flat electrical cable of claim 9, wherein the first dielectric material of each insulated conductor of the edge conductor set further comprises a thermoplastic material, and wherein the thermoplastic material of the first dielectric material is polypropylene.

12. A connector assembly comprising:
a plurality of contact pads arranged in a row and comprising a plurality of middle contact pads disposed between a pair of edge contact pads disposed at opposing ends of the row; and
the flat electrical cable of claim 9, wherein an insulated conductor of the edge conductor set is terminated at a middle contact pad, and an insulated conductor of the middle conductor set is terminated at an edge contact pad, and wherein the plurality of contact pads are part of at least one of a printed circuit board and an electrical connector.

13. A connector assembly comprising:
the flat electrical cable of claim 9; and
a plurality of contact pad sets arranged in a row, each contact pad set corresponding to a different conductor set of the cable and comprising one or more contact pads, the plurality of contact pad sets comprising a middle contact pad set disposed between two other contact pad sets and an edge contact pad set disposed at an end of the row, wherein the insulated conductors of the edge conductor set are terminated at the contact pads of the middle contact pad set, and the insulated conductors of the middle conductor set are terminated at the contact pads of the edge contact pad set.

14. A connector assembly comprising:
the flat electrical cable of claim 9; and
a circuit board comprising pluralities of first and second contact pads arranged in respective first and second rows along opposing respective first and second edges of the circuit board, the plurality of first contact pads comprising a plurality of first middle contact pads disposed between a pair of first edge contact pads disposed at opposing ends of the first row, wherein an insulated conductor of the middle conductor set of the cable is terminated at a first middle contact pad in the plurality of first middle contact pads, and an insulated conductor of the edge conductor set of the cable is terminated at a first edge contact pad in the pair of first edge contact pads, the plurality of second contact pads comprising a plurality of second middle contact pads disposed between a pair of second edge contact pads disposed at opposing ends of the second row, wherein a first conductive trace of the circuit board connects a first middle contact pad in the plurality of first middle contact pads to a second edge contact pad in the pair of second edge contact pads, and a second conductive trace of the circuit board connects a first edge contact pad in the pair of first edge contact pads to a second middle contact pad in the plurality of second middle contact pads.

15. A connector assembly comprising:
the flat electrical cable of claim 9; and
a circuit board comprising pluralities of first and second contact pad sets arranged in respective first and second rows along opposing respective first and second edges of the circuit board, each first contact pad set corresponding to a different conductor set of the cable and comprising one or more contact pads, each second contact pad set corresponding to a different first contact pad set in the plurality of first contact pad sets and comprising one or more contact pads, the plurality of first contact pad sets comprising a first middle contact pad set disposed between two other first contact pad sets and a first edge contact pad set disposed at an end of the first row, wherein the insulated conductors of the middle conductor set of the cable are terminated at the contact pads of the first middle contact pad set, and the insulated conductors of the edge conductor set of the cable are terminated at the contact pads of the first edge contact pad set, the plurality of second contact pad sets comprising a second middle contact pad set disposed between two other second contact pad sets and a second edge contact pad set disposed at an end of the second row, wherein a pair of first conductive traces of the circuit board connect the contact pads of the first middle contact pad set to the contact pads of the second edge contact pad set, and a pair of second conductive traces of the circuit board connect the contact pads of the first edge contact pad set to the contact pads of the second middle contact pad set.

* * * * *